(12) United States Patent
Togashi et al.

(10) Patent No.: US 12,040,340 B2
(45) Date of Patent: Jul. 16, 2024

(54) IMAGING ELEMENT AND IMAGING DEVICE

(71) Applicants: SONY CORPORATION, Tokyo (JP);
SONY SEMICONDUCTOR SOLUTIONS CORPORATION, Kanagawa (JP)

(72) Inventors: Hideaki Togashi, Kumamoto (JP); Moe Takeo, Tokyo (JP); Sho Nishida, Tokyo (JP); Junpei Yamamoto, Tokyo (JP); Shinpei Fukuoka, Kanagawa (JP); Takushi Shigetoshi, Kumamoto (JP)

(73) Assignees: SONY CORPORATION, Tokyo (JP);
SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 664 days.

(21) Appl. No.: 17/250,348

(22) PCT Filed: Jul. 1, 2019

(86) PCT No.: PCT/JP2019/026116
§ 371 (c)(1),
(2) Date: Jan. 8, 2021

(87) PCT Pub. No.: WO2020/017305
PCT Pub. Date: Jan. 23, 2020

(65) Prior Publication Data
US 2021/0273006 A1 Sep. 2, 2021

(30) Foreign Application Priority Data
Jul. 17, 2018 (JP) ................................ 2018-134286

(51) Int. Cl.
*H01L 27/146* (2006.01)
*H01L 23/48* (2006.01)

(52) U.S. Cl.
CPC ...... *H01L 27/14636* (2013.01); *H01L 23/481* (2013.01); *H01L 27/14612* (2013.01); *H01L 27/14638* (2013.01)

(58) Field of Classification Search
CPC .................... H01L 27/14636; H01L 27/14638
See application file for complete search history.

(56) References Cited

U.S. PATENT DOCUMENTS

| 6,825,455 B1 | 11/2004 | Schwarte |
| 2017/0148838 A1 | 5/2017 | Togashi |
| 2018/0286922 A1 | 10/2018 | Togashi |

FOREIGN PATENT DOCUMENTS

| CN | 102024831 A | 4/2011 |
| CN | 107146850 A | 9/2017 |

(Continued)

OTHER PUBLICATIONS

International Search Report and Written Opinion of PCT Application No. PCT/JP2019/026116, dated Sep. 10, 2019, 09 pages of ISRWO.

(Continued)

*Primary Examiner* — David A Zarneke
(74) *Attorney, Agent, or Firm* — CHIP LAW GROUP

(57) ABSTRACT

Provided is an imaging element that includes a semiconductor substrate, a first photoelectric converter, a through electrode, a first dielectric film, and a second dielectric film. The semiconductor substrate has one surface and another surface that are opposed to each other. The semiconductor substrate has a through hole penetrating between the one surface and the other surface. The first photoelectric converter is provided above the one surface of the semiconductor substrate. The through electrode is electrically coupled to the first photoelectric converter and penetrates the semiconductor substrate inside the through hole. The first dielectric film is provided on the one surface of the semiconductor substrate (Continued)

and has a first film thickness. The second dielectric film is provided on a side surface of the through hole and has a second film thickness. The second film thickness is less than the first film thickness.

18 Claims, 25 Drawing Sheets

(56) References Cited

FOREIGN PATENT DOCUMENTS

| | | |
|---|---|---|
| CN | 107534749 A | 1/2018 |
| CN | 107851607 A | 3/2018 |
| CN | 109716527 A | 5/2019 |
| JP | 2011-029337 A | 2/2011 |
| JP | 2017-073436 A | 4/2017 |
| JP | 2018-098495 A | 6/2018 |
| KR | 10-2018-0066020 A | 6/2018 |
| TW | 201801297 A | 1/2018 |
| TW | 201834229 A | 9/2018 |
| WO | 2017/061082 A1 | 4/2017 |
| WO | 2018/066256 A1 | 4/2018 |
| WO | 2018/110636 A | 6/2018 |

OTHER PUBLICATIONS

Office Action for CN Patent Application No. 201980045788.9, issued on May 2, 2024, 02 pages of English Translation and 02 pages of Office Action.

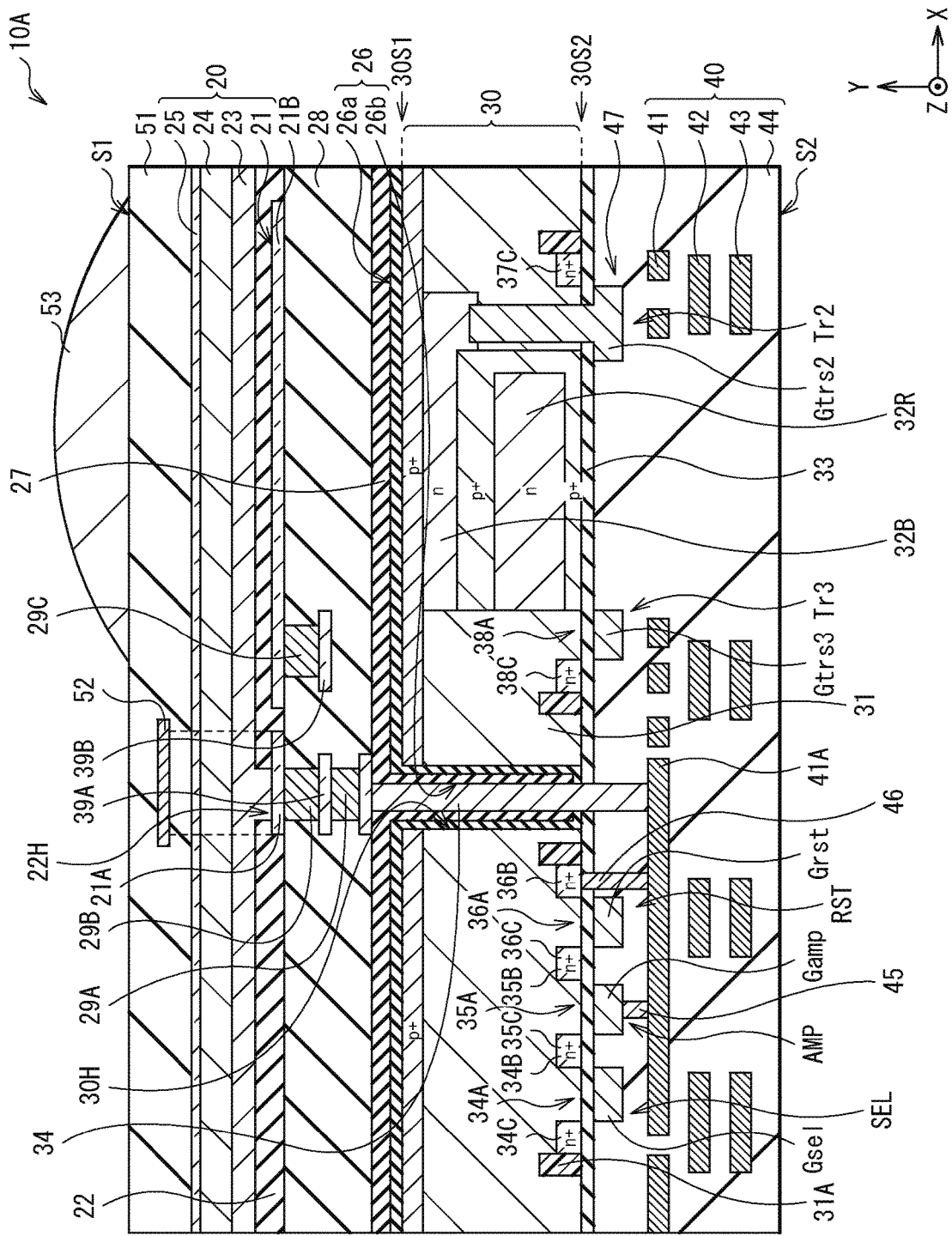
[FIG. 1]

[FIG. 2]
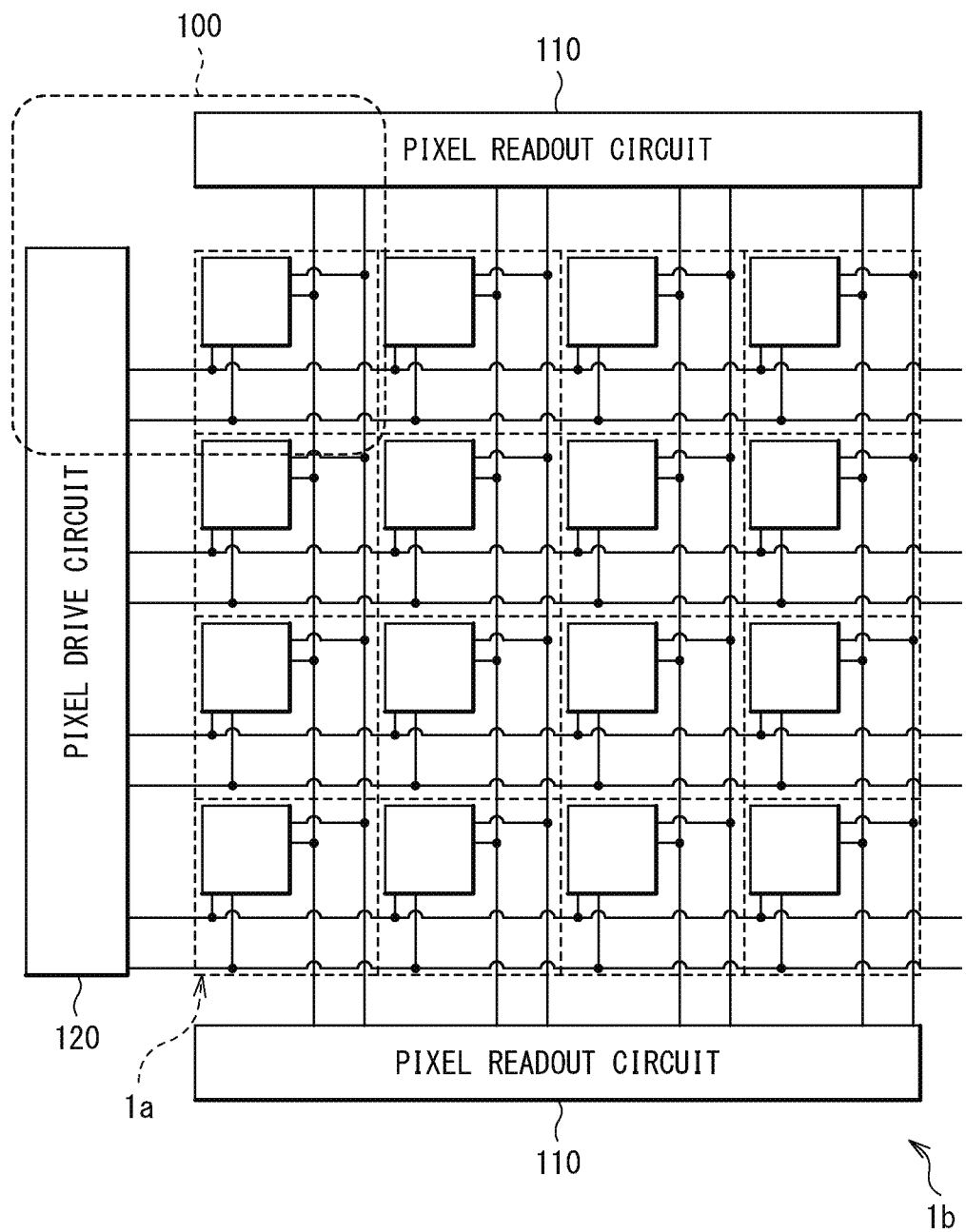

[FIG. 3]
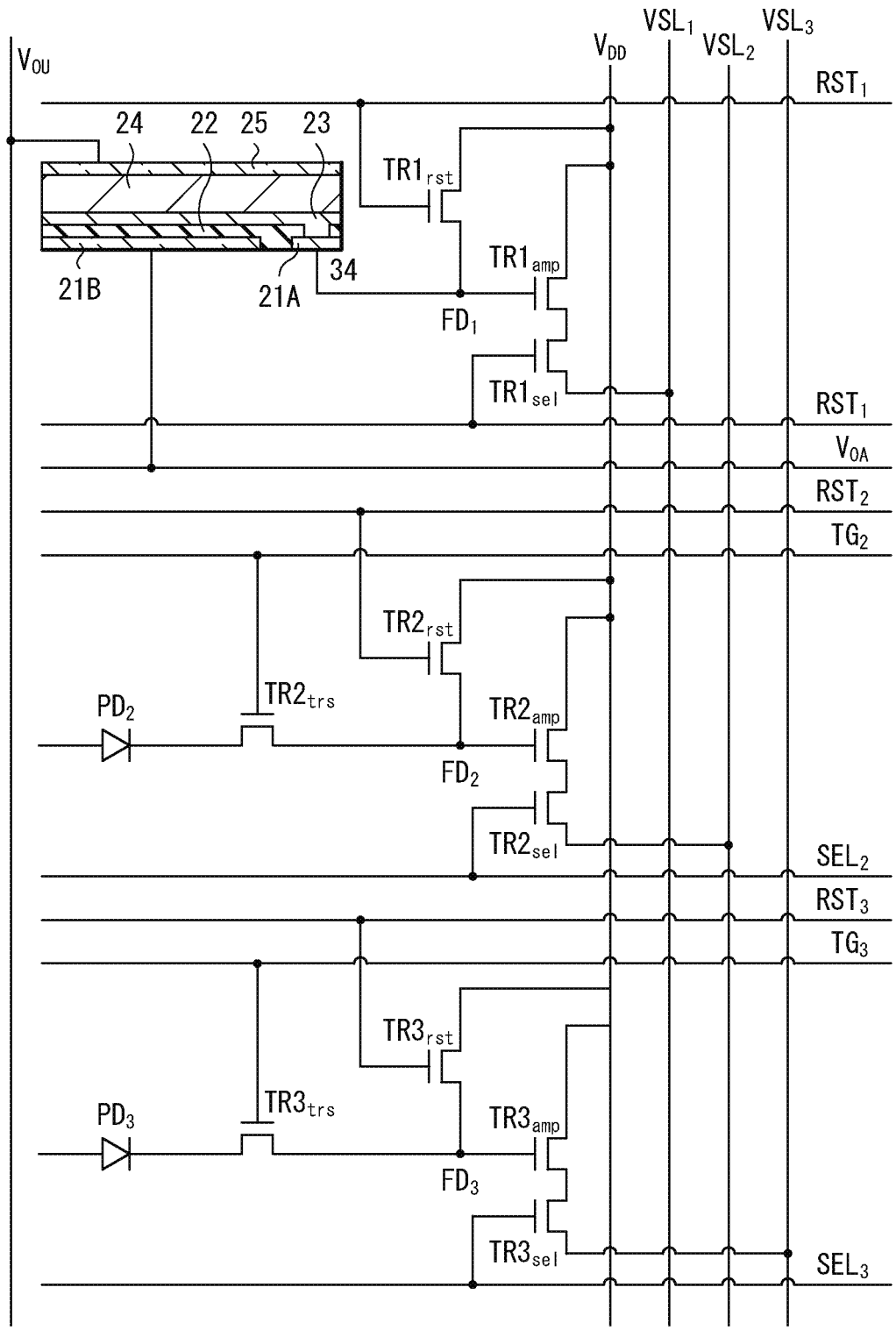

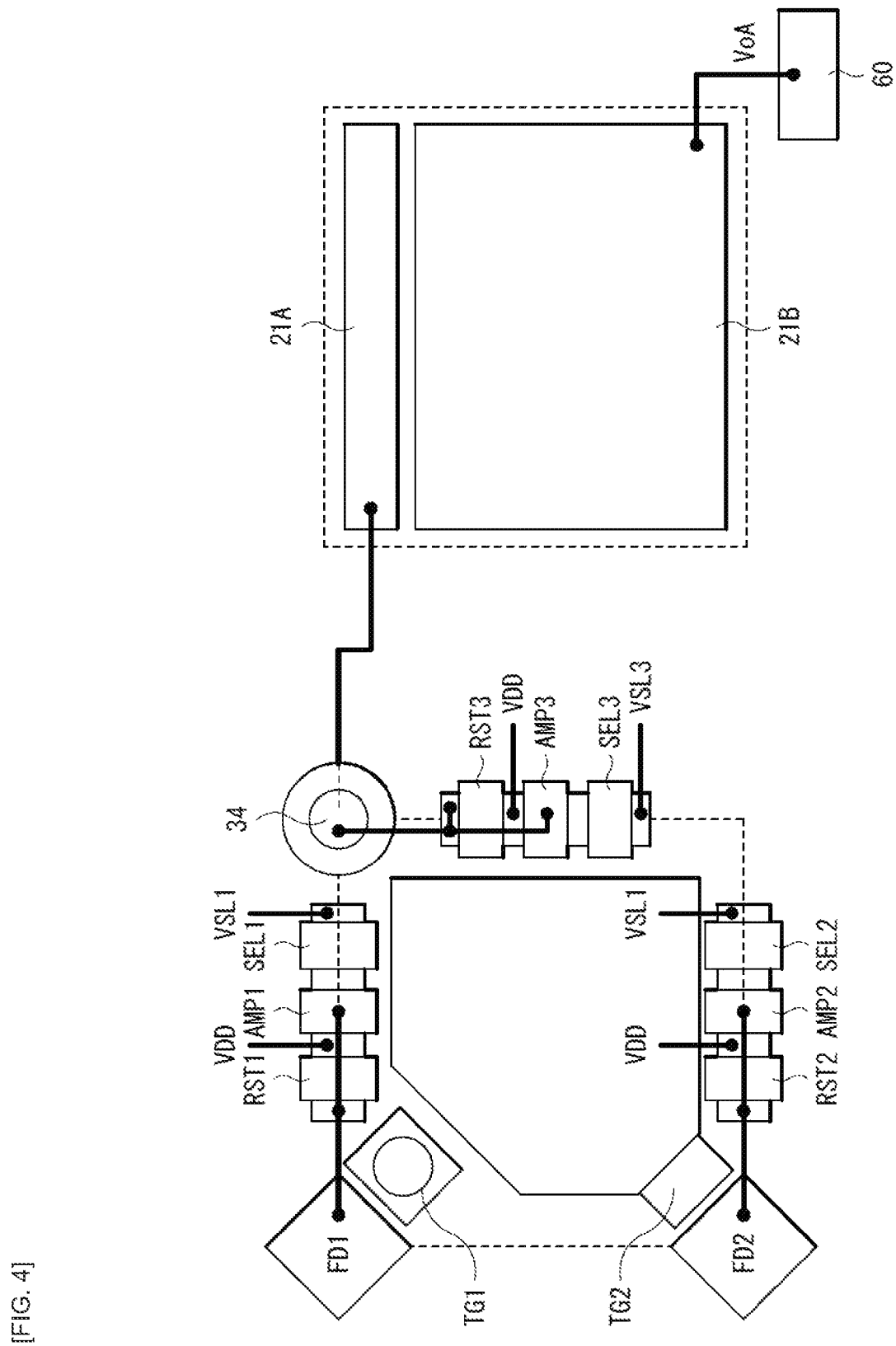
[FIG. 4]

[FIG. 5A]
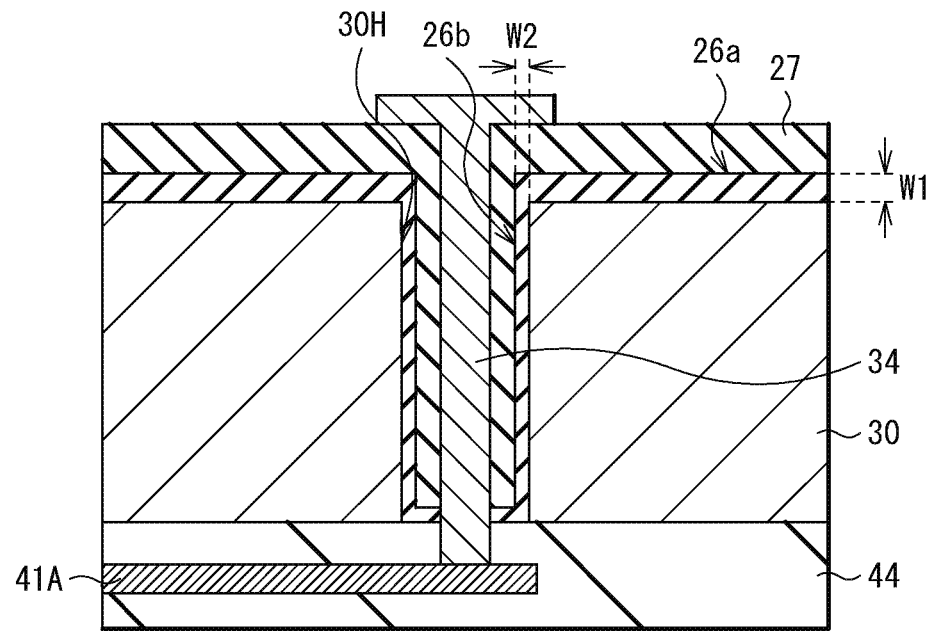
FIG. 5B
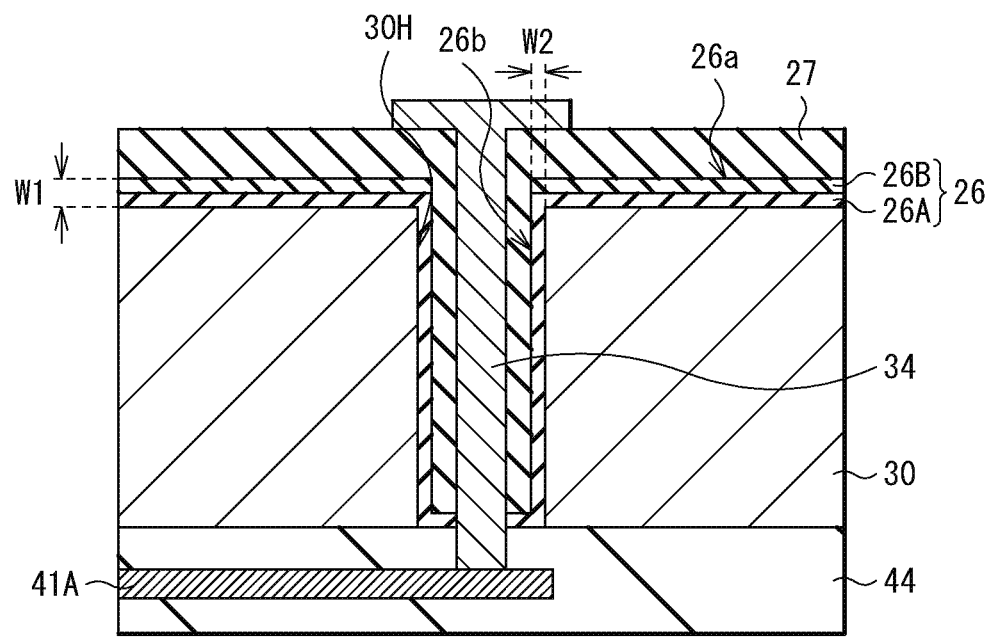

[FIG. 5C]
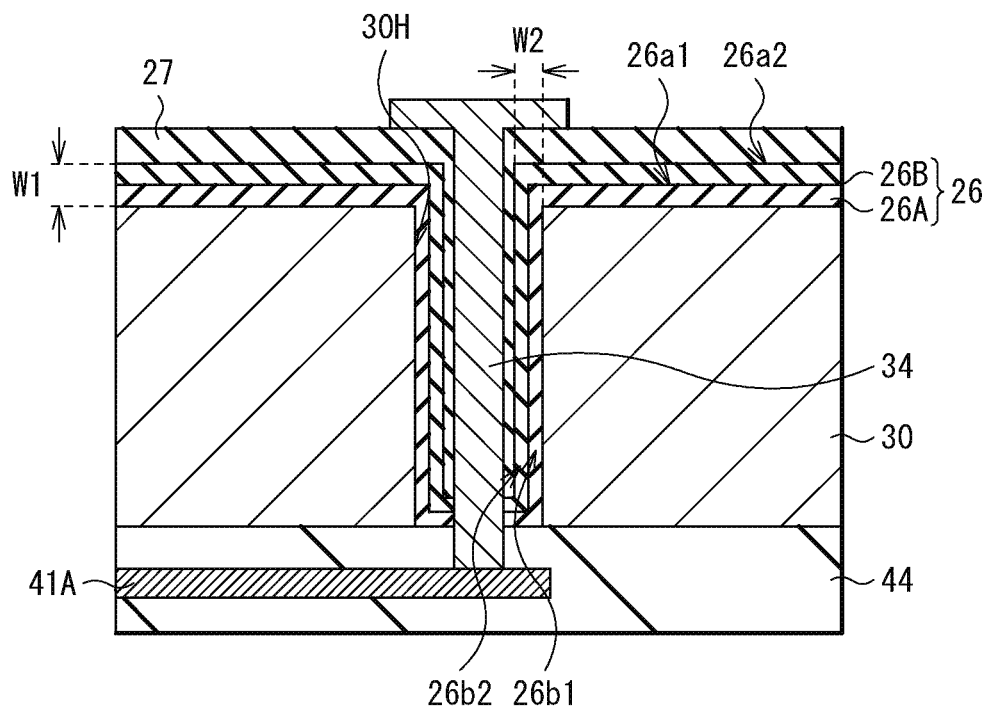
FIG. 5D
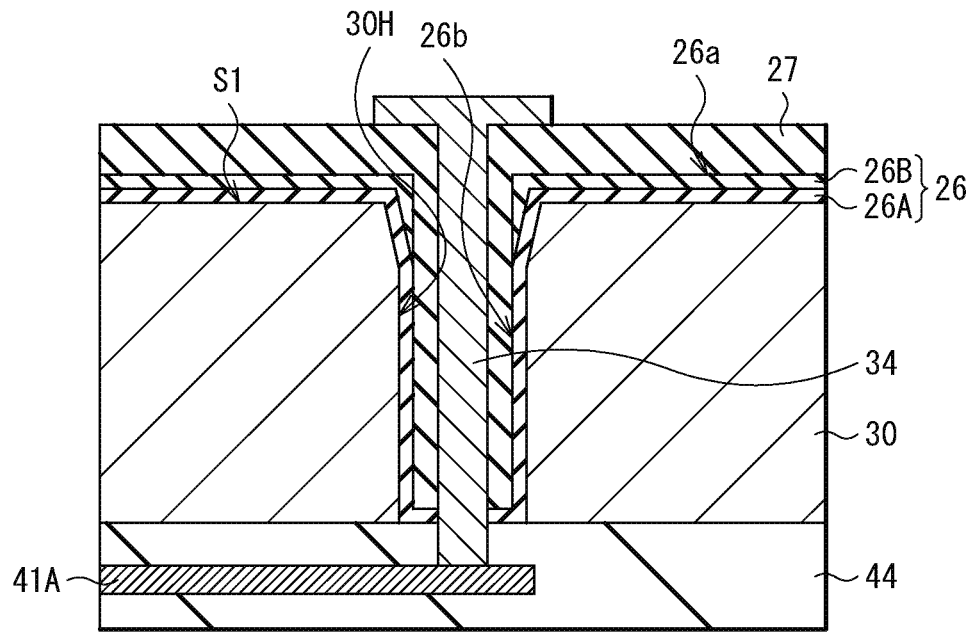

[FIG. 6]
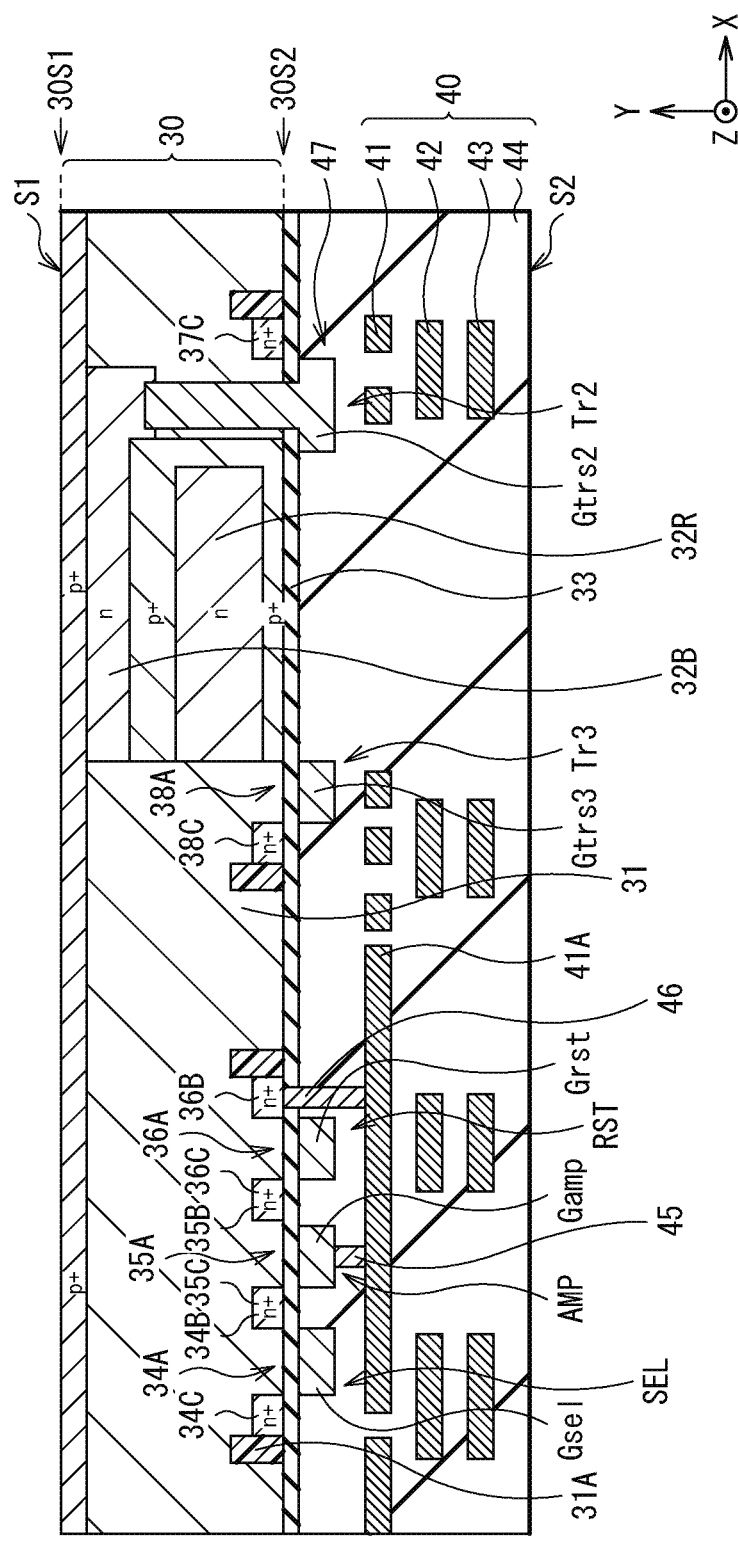

[FIG. 7]
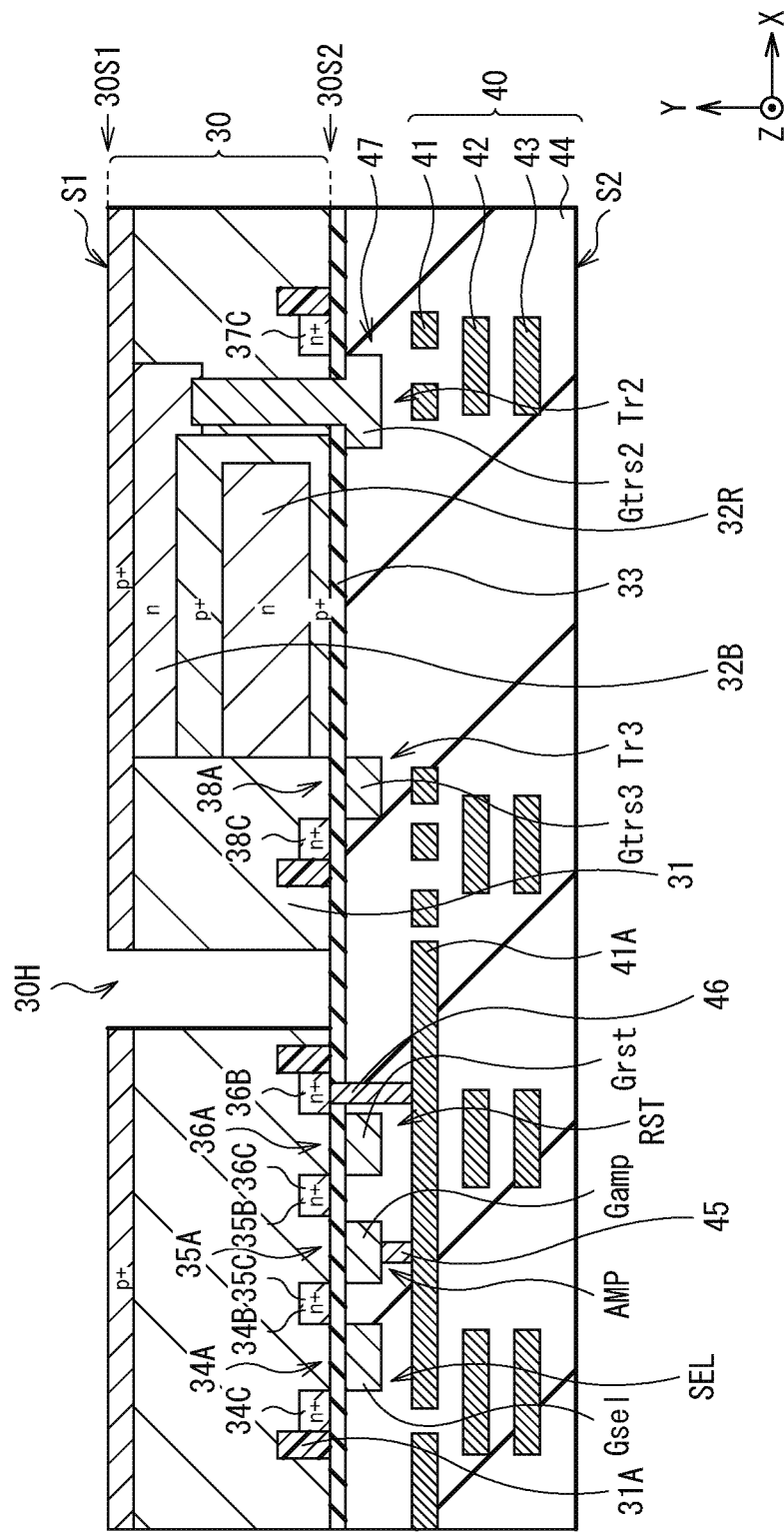

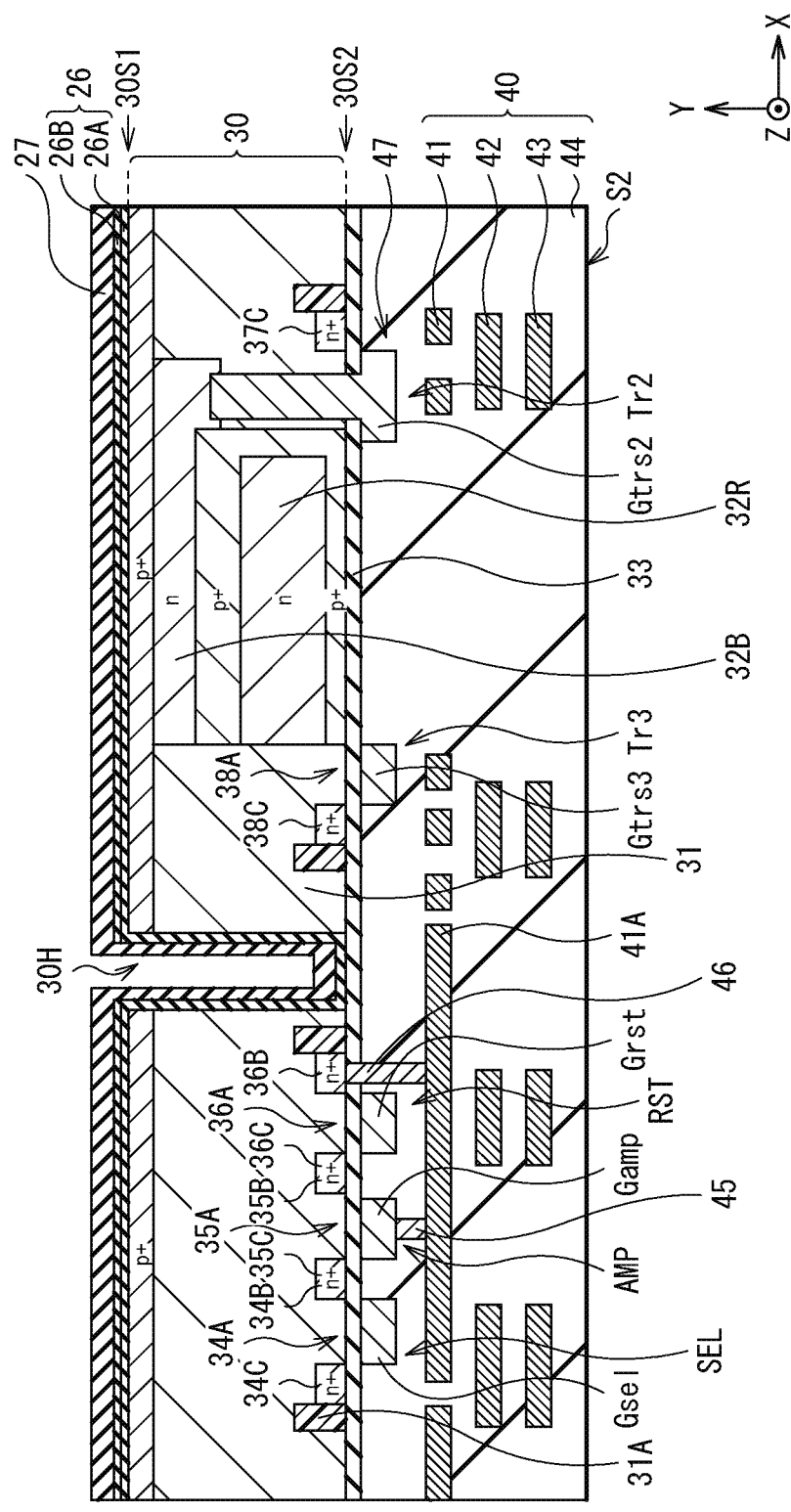
[FIG. 8]

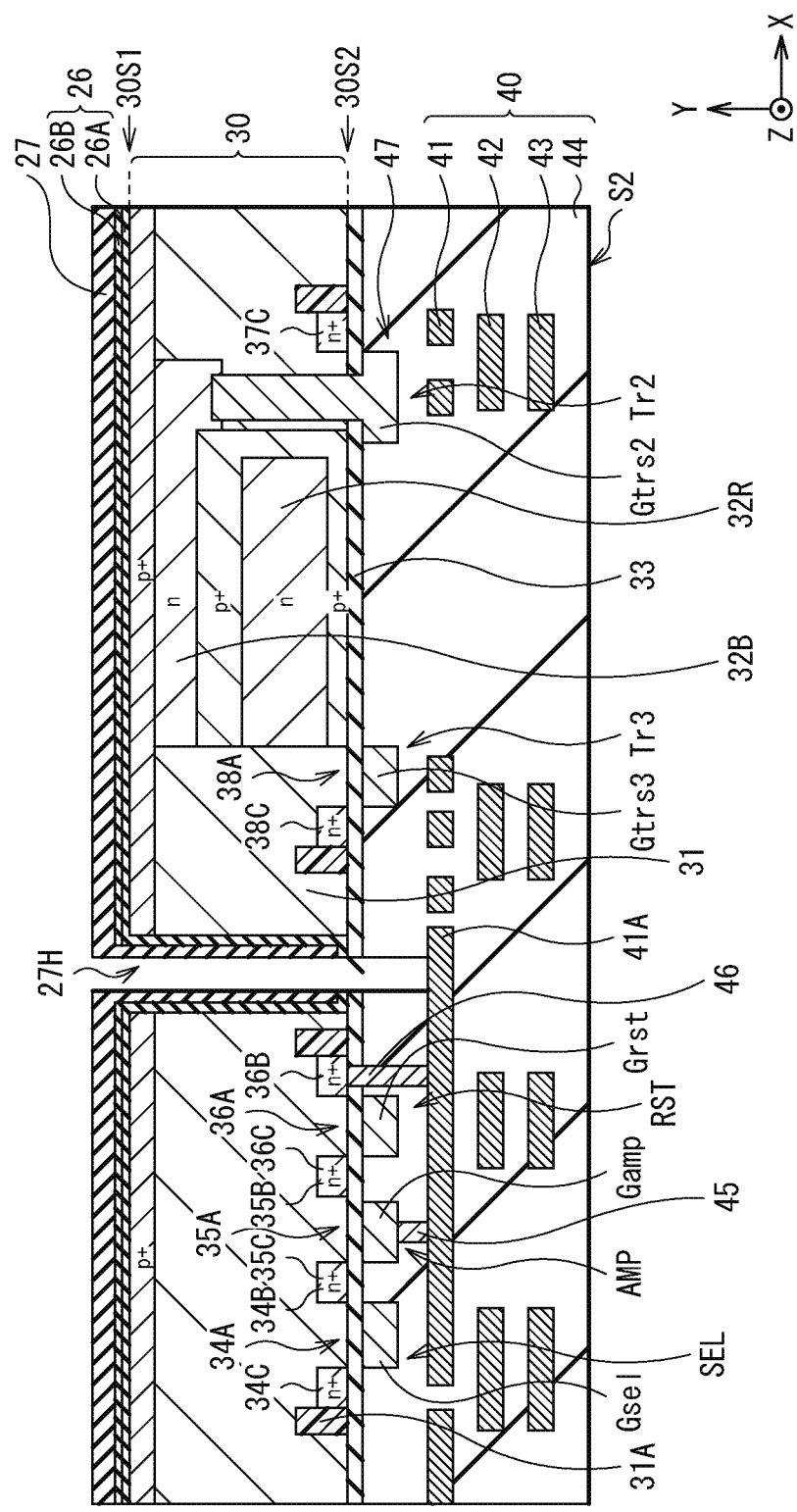
[FIG. 9]

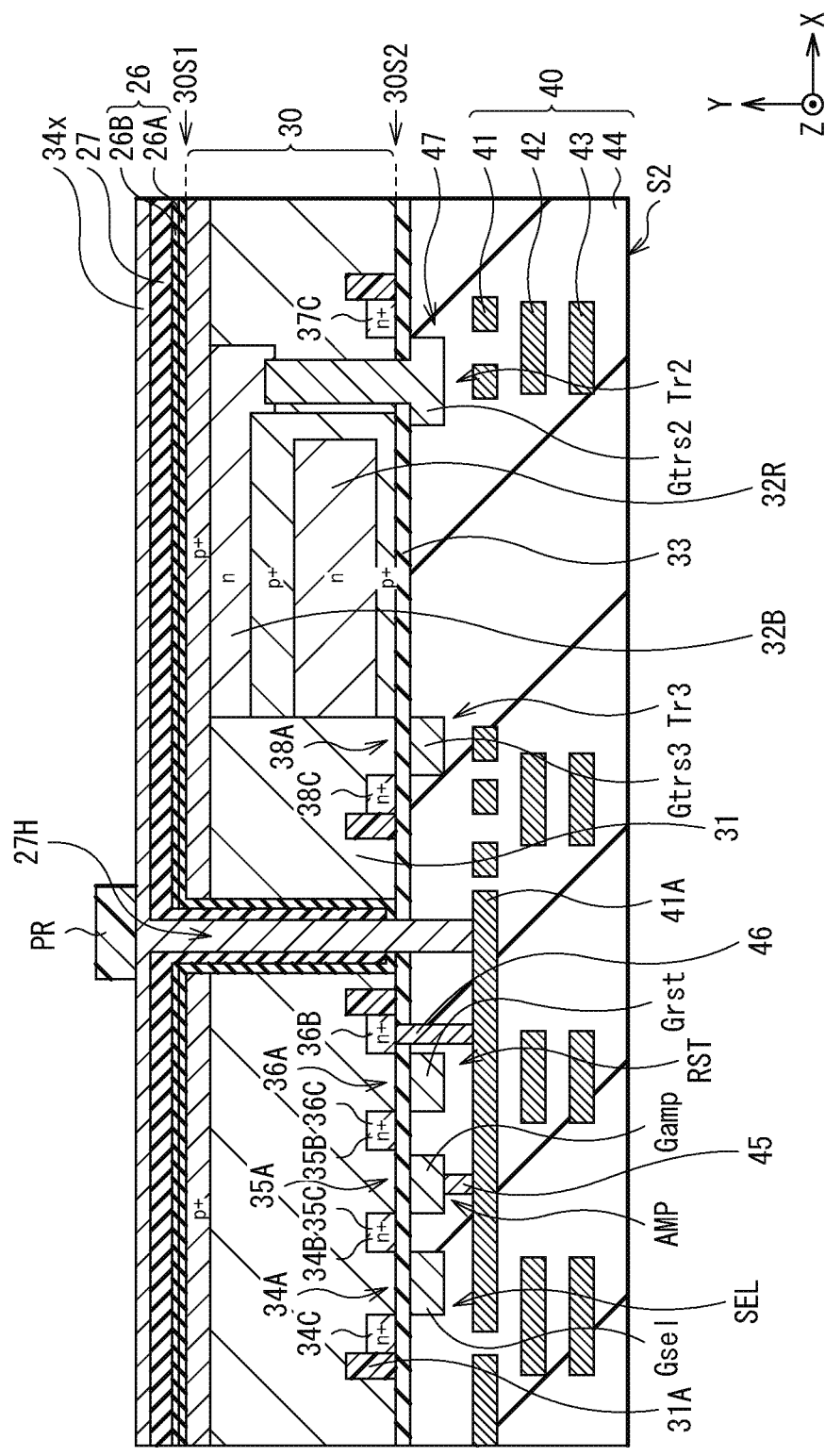
[FIG. 10]

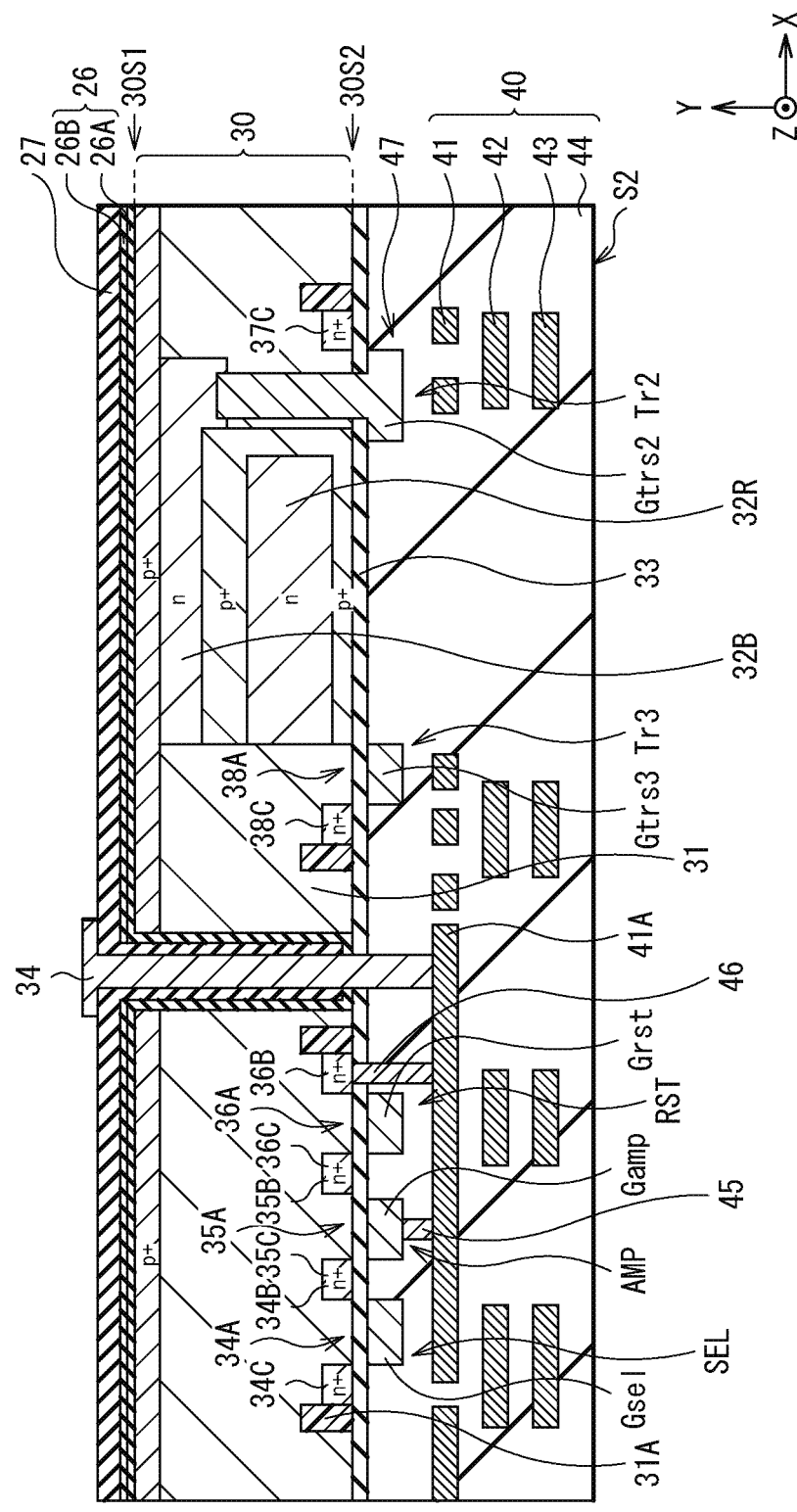

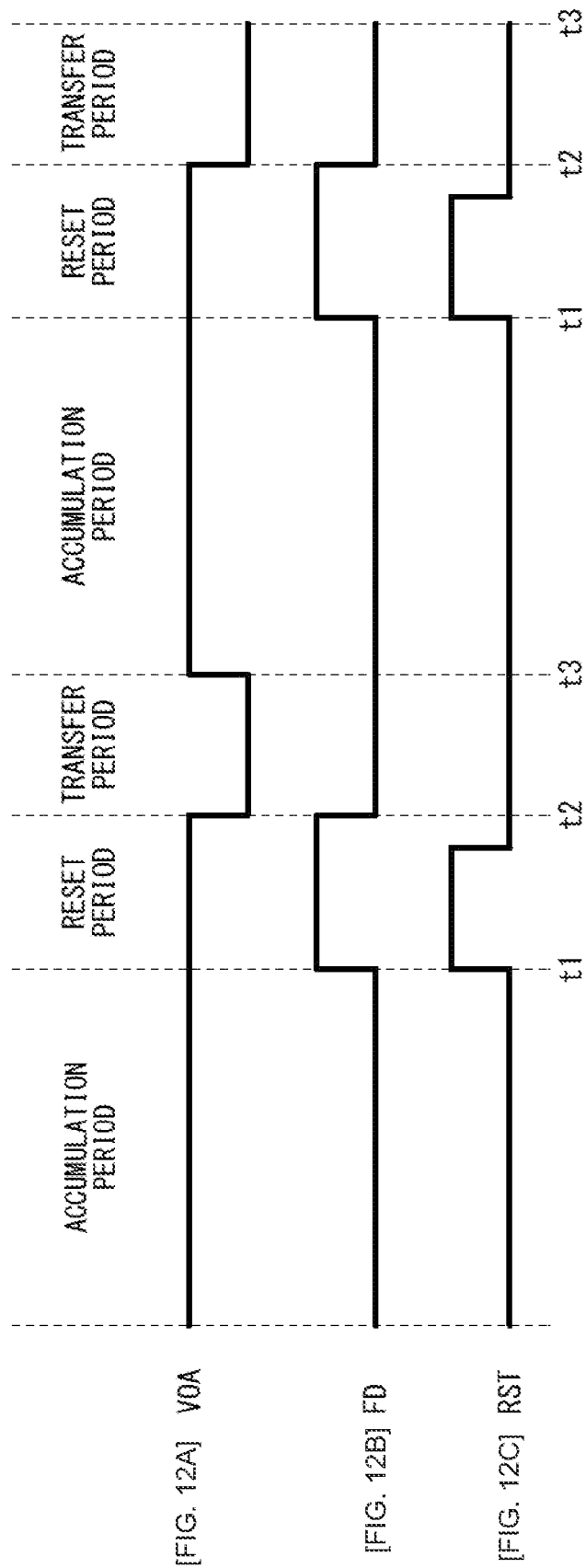

[FIG. 13]
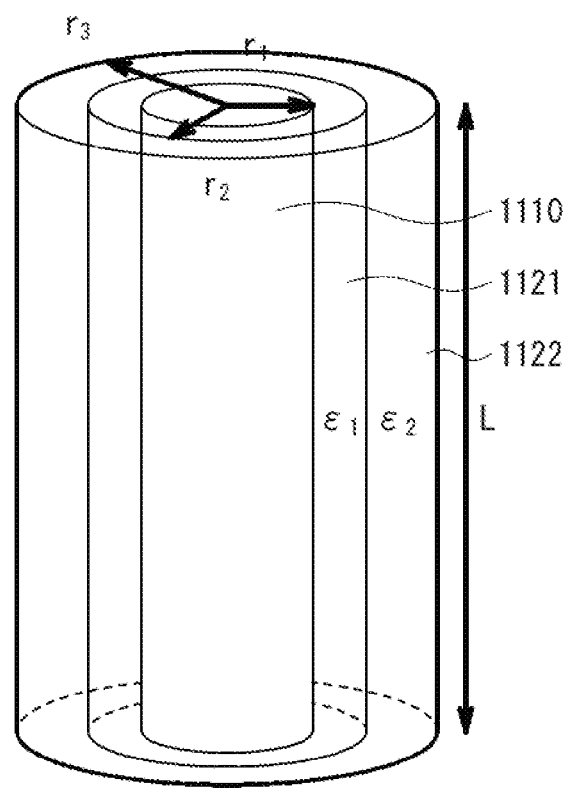

[FIG. 14]
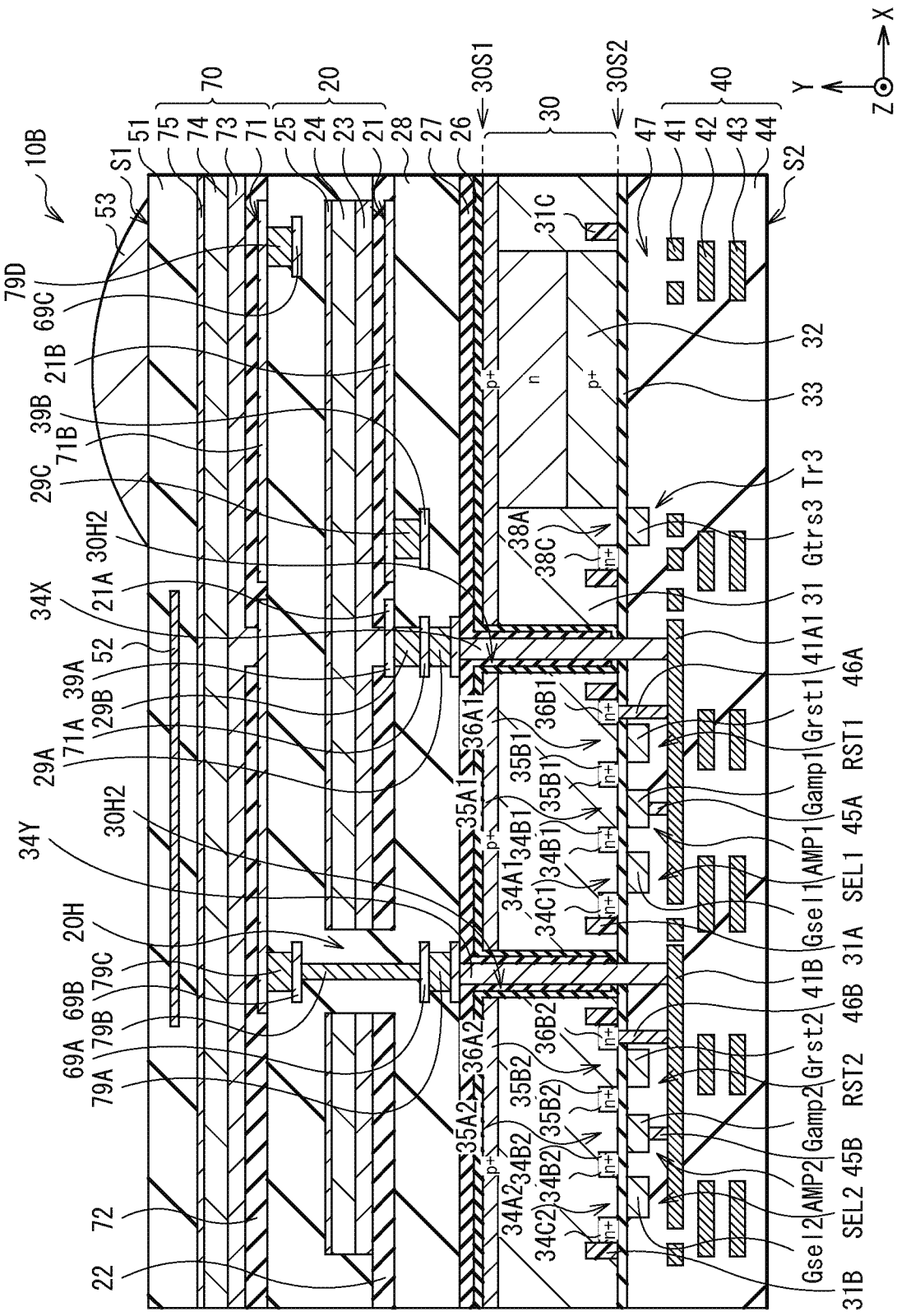

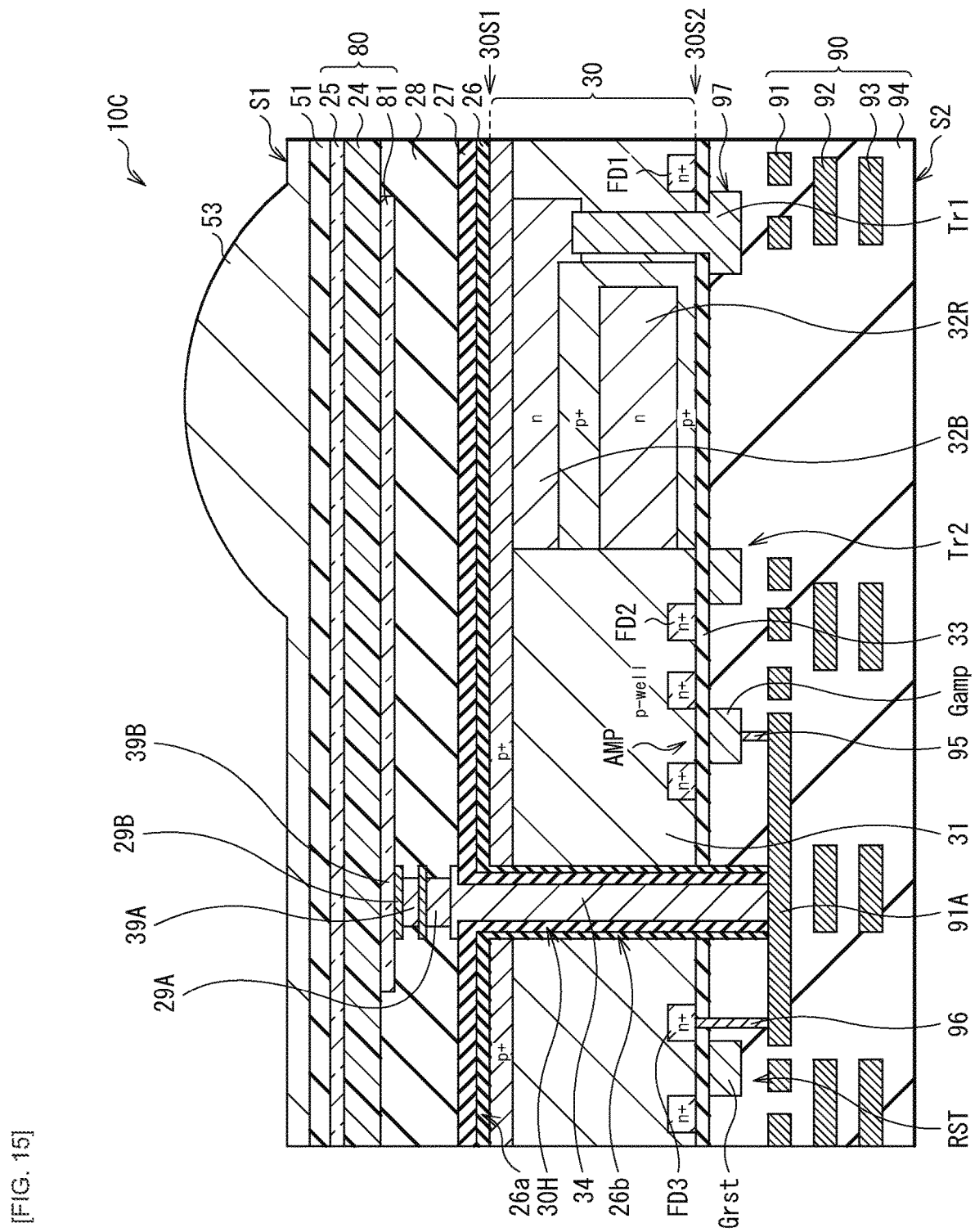
[FIG. 15]

[FIG. 16]
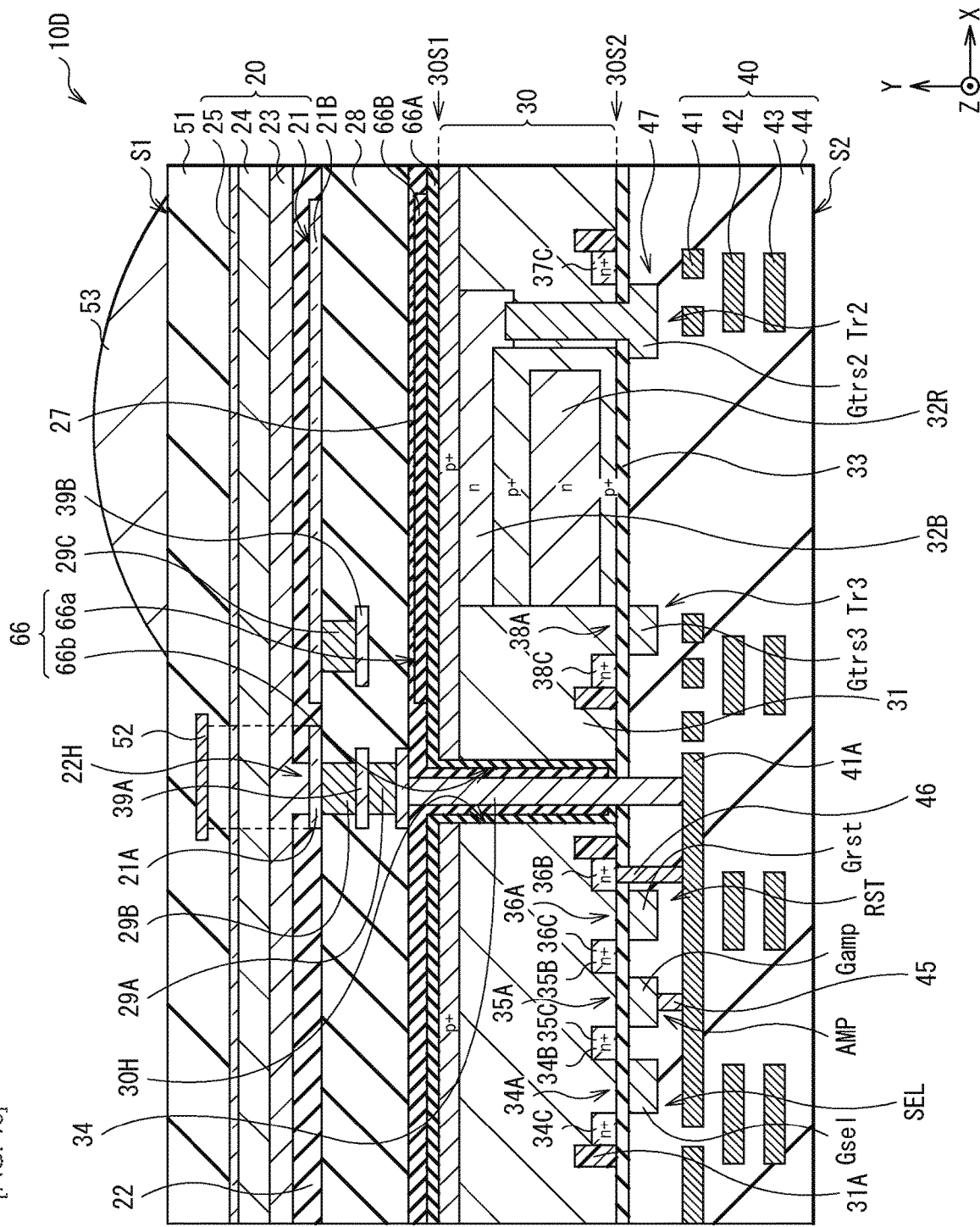

[FIG. 17]
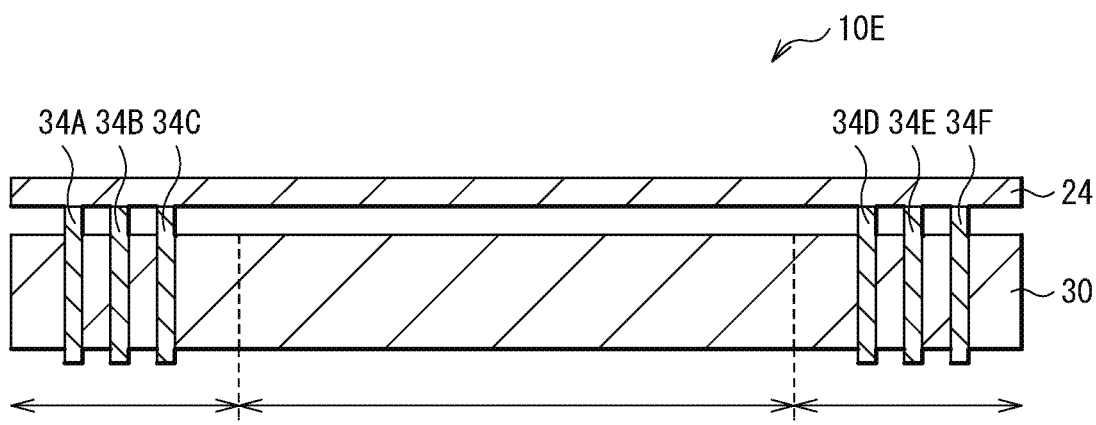

[FIG. 18]
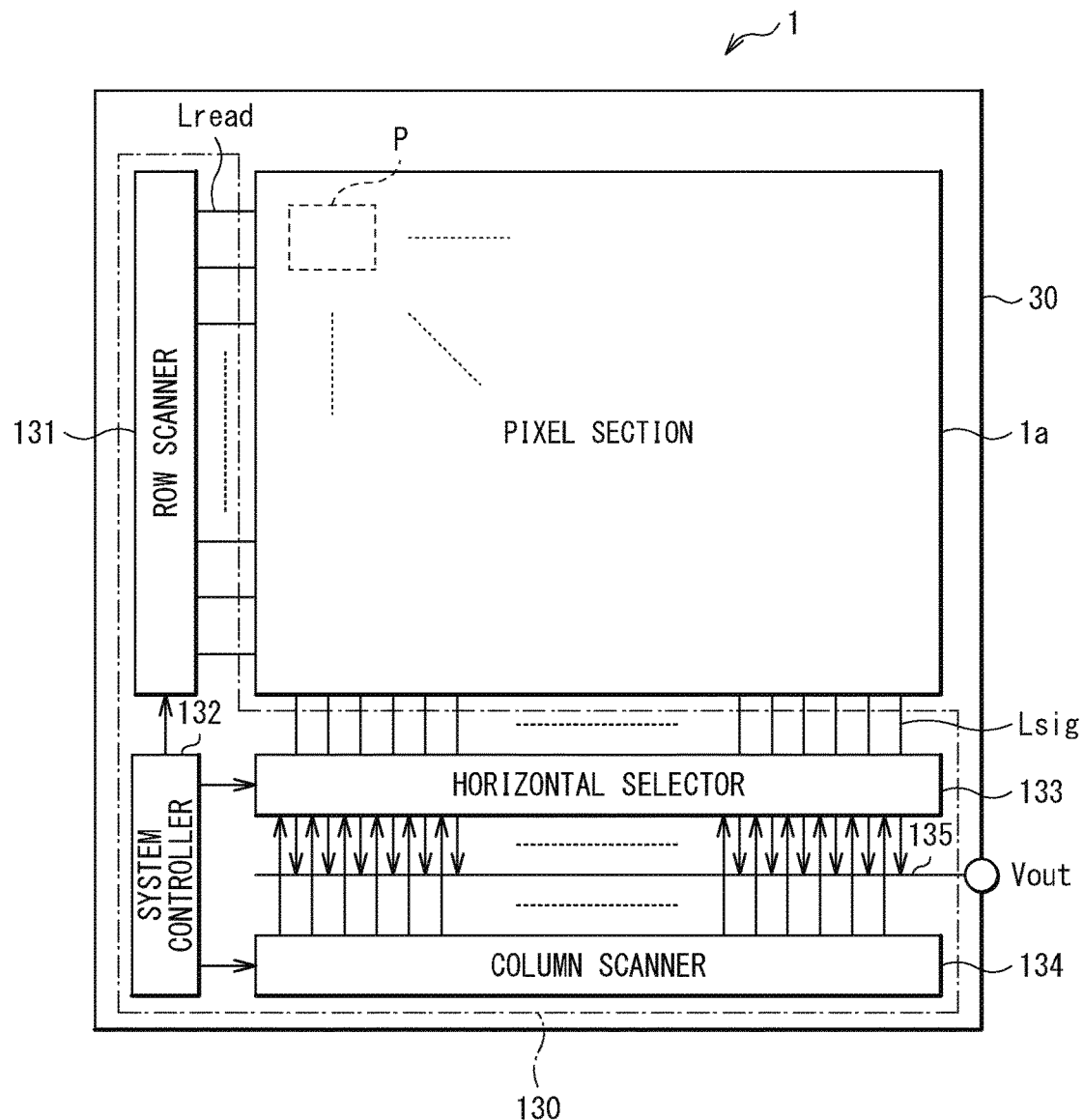

[FIG. 19]
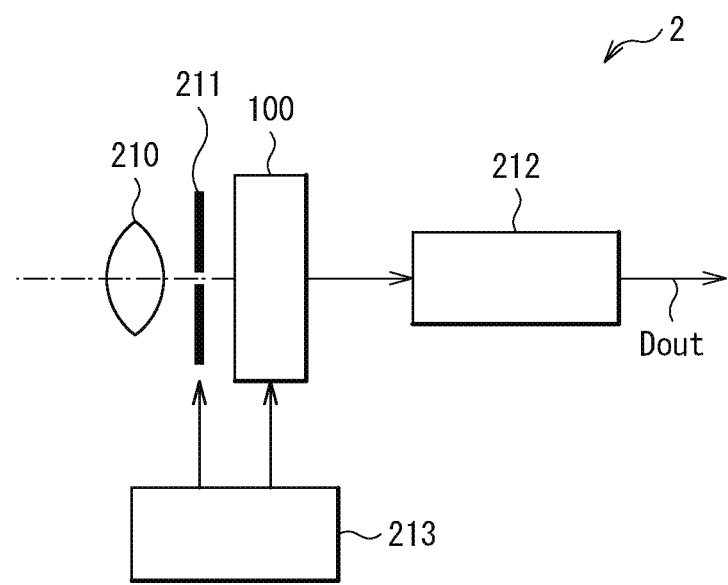

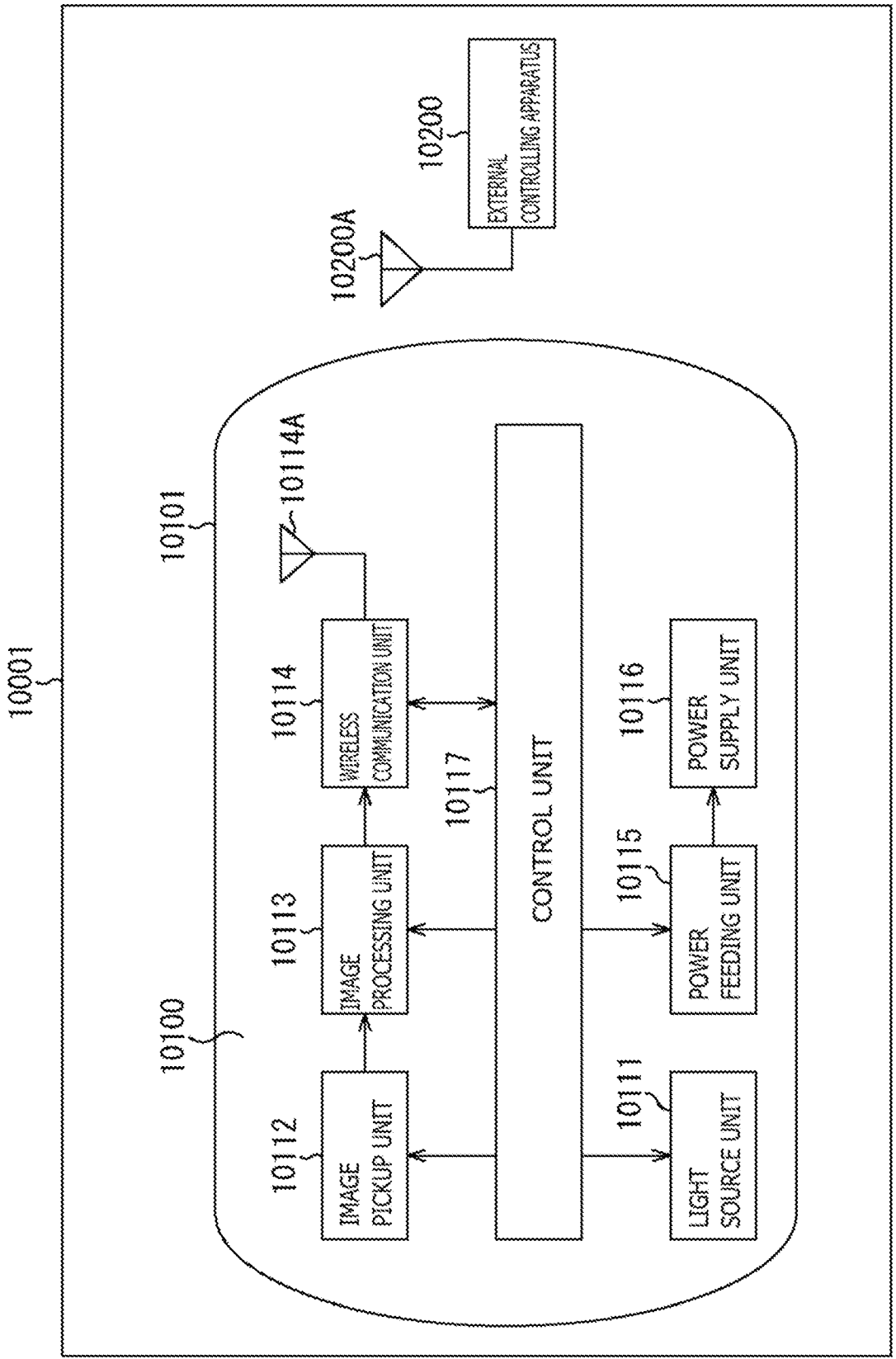
[FIG. 20]

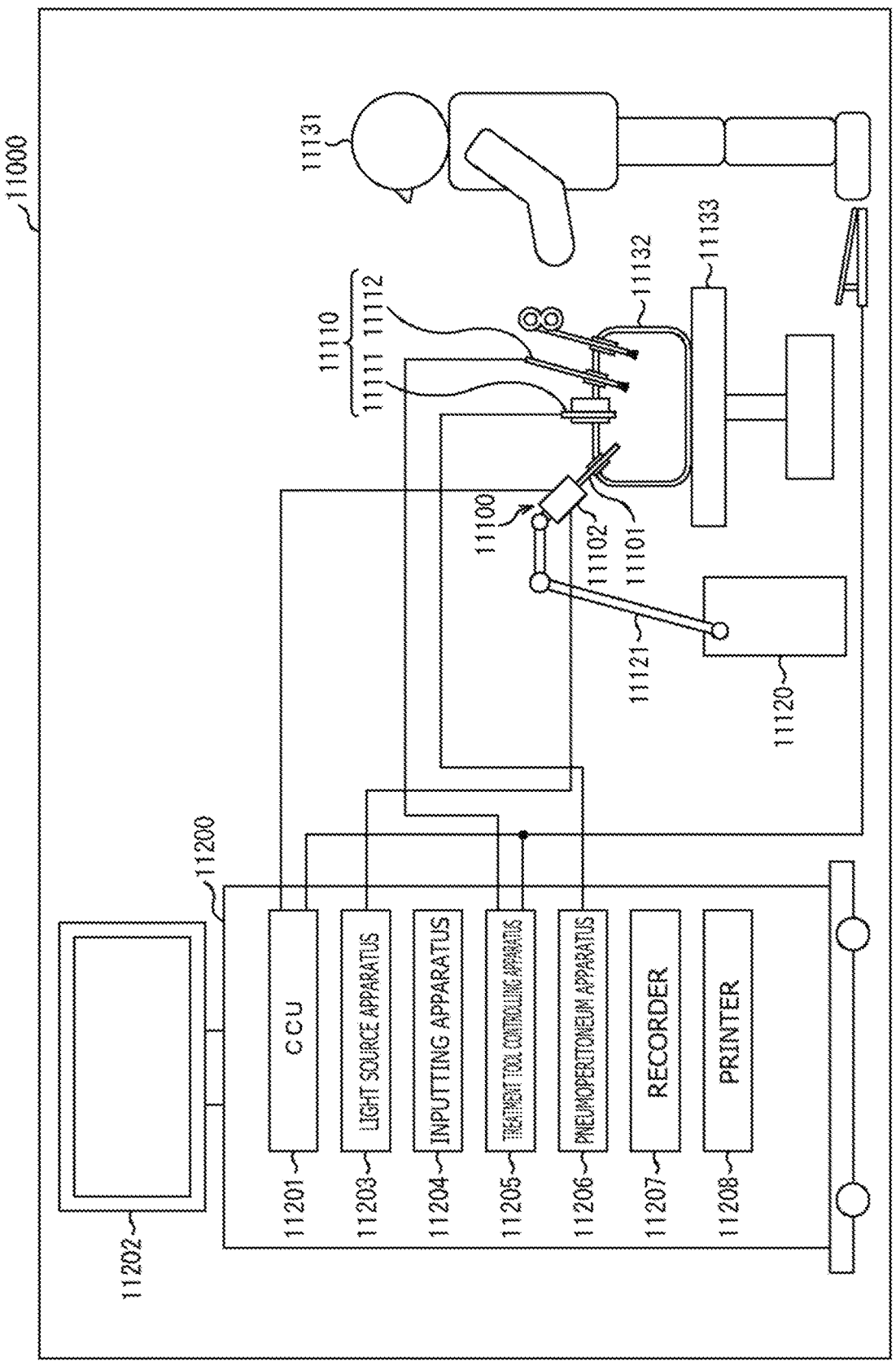
[FIG. 21]

[FIG. 22]
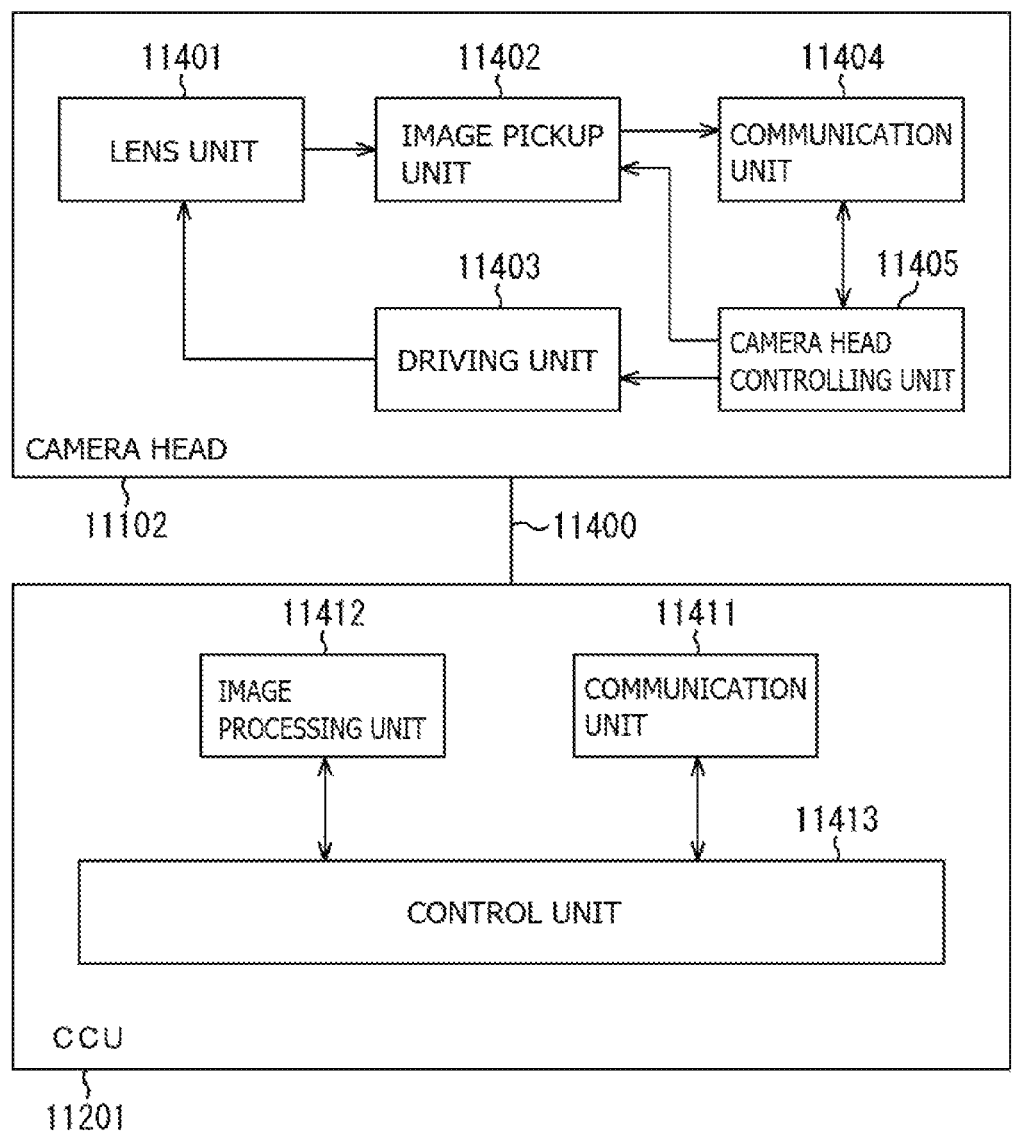

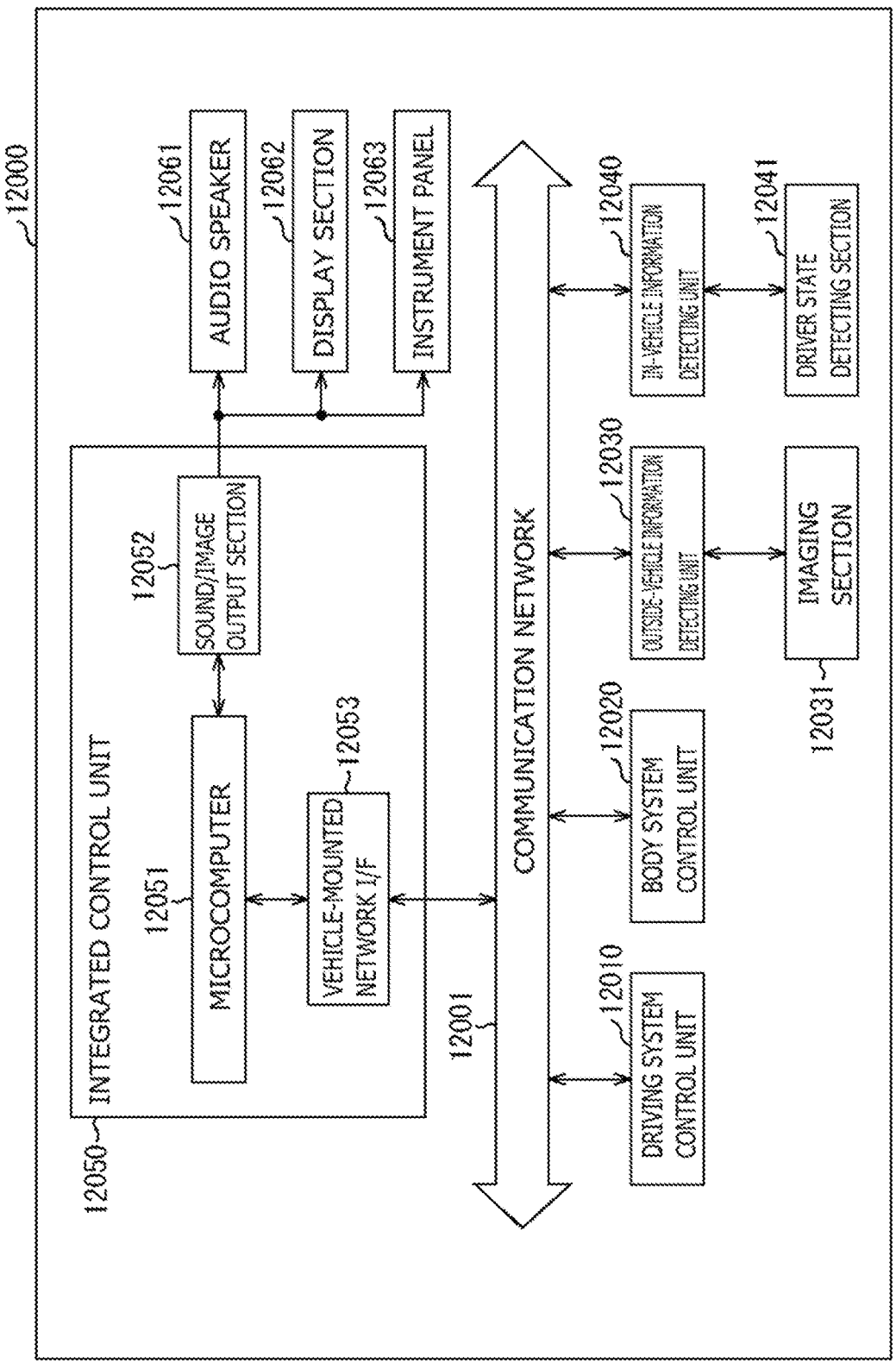
[FIG. 23]

[FIG. 24]
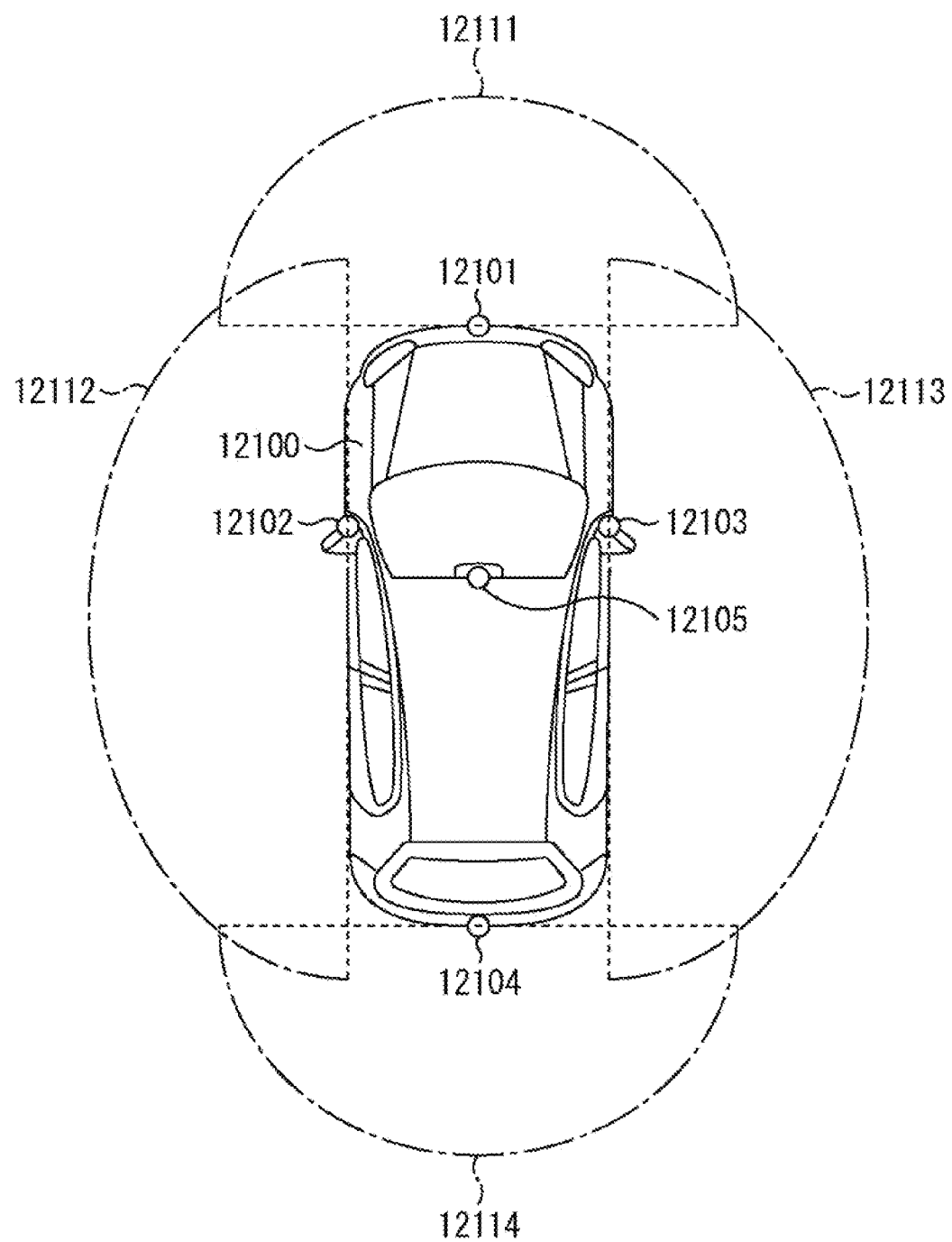

IMAGING ELEMENT AND IMAGING DEVICE

CROSS REFERENCE TO RELATED APPLICATIONS

This application is a U.S. National Phase of International Patent Application No. PCT/JP2019/026116 filed on Jul. 1, 2019, which claims priority benefit of Japanese Patent Application No. JP 2018-134286 filed in the Japan Patent Office on Jul. 17, 2018. Each of the above-referenced applications is hereby incorporated herein by reference in its entirety.

TECHNICAL FIELD

The present disclosure relates to an imaging element including, for example, an organic material and an imaging device including this.

BACKGROUND ART

In CCD (Charge Coupled Device) image sensors, CMOS (Complementary Metal Oxide Semiconductor) image sensors, or the like, solid-state imaging devices are widely used that each have pixel arrangement in which primary color filters of red, green, blue are two-dimensionally arranged. However, a solid-state imaging device having such pixel arrangement performs an interpolation process between pixels when generating the respective color signals. This generates so-called false colors.

A solid-state imaging element in which photoelectric conversion regions are stacked has been developed for this. The photoelectric conversion regions are used to photoelectrically convert the respective pieces of light in the red, green, and blue wavelength bands. In addition, a structure has been proposed for installing the photoelectric conversion regions outside the semiconductor substrate. For example, a solid-state imaging element is developed that disposes a photoelectric converter above the semiconductor substrate and accumulates signal charges generated by the photoelectric converter in the semiconductor substrate. As a back-illuminated solid-state imaging element to which the above-described structure is applied, for example, PTL 1 discloses a solid-state imaging device that is provided with a through electrode on the semiconductor substrate and transfers signal charges generated by an organic photoelectric converter to the front surface side of the semiconductor substrate via this through electrode. The organic photoelectric converter is disposed on the back surface side of the semiconductor substrate.

CITATION LIST

Patent Literature

PTL 1: Japanese Unexamined Patent Application Publication No. 2011-29337

SUMMARY OF THE INVENTION

Incidentally, an imaging device is required to increase sensitivity characteristics.

It is desirable to provide an imaging element and an imaging device that make it possible to increase sensitivity characteristics.

An imaging element according to an embodiment of the present disclosure includes: a semiconductor substrate; a first photoelectric converter; a through electrode; a first dielectric film; and a second dielectric film. The semiconductor substrate has one surface and another surface that are opposed to each other. The semiconductor substrate has a through hole penetrating between the one surface and the other surface. The first photoelectric converter is provided above the one surface of the semiconductor substrate. The through electrode is electrically coupled to the first photoelectric converter. The through electrode penetrates the semiconductor substrate inside the through hole. The first dielectric film is provided on the one surface of the semiconductor substrate. The first dielectric film has first film thickness. The second dielectric film is provided on a side surface of the through hole. The second dielectric film has second film thickness. The second film thickness is less than the first film thickness.

An imaging device according to an embodiment of the present disclosure includes, for each of a plurality of pixels, one or more imaging elements according to the above-described embodiment of the present disclosure.

In the imaging element according to the embodiment of the present disclosure and the imaging device according to the embodiment, the first dielectric film having the first film thickness is provided on the one surface of the semiconductor substrate above which the first photoelectric converter is disposed. The second dielectric film having the second film thickness is provided on the side surface of the through hole penetrating between the one surface and the other surface of the semiconductor substrate. The film thickness (second film thickness) of the second dielectric film is less than the film thickness (first film thickness) of the first dielectric film. The through electrode is provided inside the through hole. The through electrode is electrically coupled to the first photoelectric converter and penetrates the semiconductor substrate. This reduces the reflection of incident light on the one surface of the semiconductor substrate while suppressing an increase in the capacitance of the through electrode.

The imaging element according to the embodiment of the present disclosure and the imaging device according to the embodiment are each provided with the first insulating film having the first film thickness on the one surface of the semiconductor substrate and the second insulating film having film thickness (second film thickness) less than the film thickness of the first insulating film on the side surface of the through hole. This reduces the reflection of incident light on the one surface of the semiconductor substrate while suppressing an increase in the capacitance of the through electrode. The through hole penetrates between the one surface and the other surface of the semiconductor substrate and has the through electrode formed therein. It is thus possible to provide the imaging element having high sensitivity characteristics and the imaging device including this.

It is to be noted that the effects described here are not necessarily limited, but any of effects described in the present disclosure may be included.

BRIEF DESCRIPTION OF DRAWING

FIG. 1 is a cross-sectional schematic diagram illustrating an example of a configuration of an imaging element according to a first embodiment of the present disclosure.

FIG. 2 is a diagram illustrating an overall configuration of the imaging element illustrated in FIG. 1.

FIG. 3 is an equivalent circuit diagram of the imaging element illustrated in FIG. 1.

FIG. 4 is a schematic diagram illustrating disposition of a lower electrode and a transistor included in a control section of the imaging element illustrated in FIG. 1.

FIG. 5A is a cross-sectional schematic diagram illustrating an example of a configuration of a dielectric film around a through electrode in the imaging element illustrated in FIG. 1.

FIG. 5B is a cross-sectional schematic diagram illustrating another example of the configuration of the dielectric film around the through electrode in the imaging element illustrated in FIG. 1.

FIG. 5C is a cross-sectional schematic diagram illustrating another example of the configuration of the dielectric film around the through electrode in the imaging element illustrated in FIG. 1.

FIG. 5D is a cross-sectional schematic diagram illustrating another example of the configuration of the dielectric film around the through electrode in the imaging element illustrated in FIG. 1.

FIG. 6 is a cross-sectional view for describing a method of manufacturing the imaging element illustrated in FIG. 1.

FIG. 7 is a cross-sectional view illustrating a step subsequent to FIG. 6.

FIG. 8 is a cross-sectional view illustrating a step subsequent to FIG. 7.

FIG. 9 is a cross-sectional view illustrating a step subsequent to FIG. 8.

FIG. 10 is a cross-sectional view illustrating a step subsequent to FIG.

FIG. 11 is a cross-sectional view illustrating a step subsequent to FIG.

FIGS. 12A, 12B, and 12C are timing charts illustrating an operation example of the imaging element illustrated in FIG. 1.

FIG. 13 is a schematic diagram for describing capacitance of the through electrode.

FIG. 14 is a cross-sectional schematic diagram illustrating an example of a configuration of an imaging element according to a second embodiment of the present disclosure.

FIG. 15 is a cross-sectional schematic diagram illustrating an example of a configuration of an imaging element according to a third embodiment of the present disclosure.

FIG. 16 is a cross-sectional schematic diagram illustrating an example of a configuration of an imaging element according to a modification example 1 of the present disclosure.

FIG. 17 is a cross-sectional schematic diagram illustrating an example of a schematic configuration of a main section of an imaging element according to a modification example 2 of the present disclosure.

FIG. 18 is a block diagram illustrating a configuration of an imaging device including the imaging element illustrated in FIG. 1 or the like as a pixel.

FIG. 19 is a functional block diagram illustrating an example of an electronic apparatus (camera) including the imaging device illustrated in FIG. 18.

FIG. 20 is a block diagram depicting an example of a schematic configuration of an in-vivo information acquisition system.

FIG. 21 is a view depicting an example of a schematic configuration of an endoscopic surgery system.

FIG. 22 is a block diagram depicting an example of a functional configuration of a camera head and a camera control unit (CCU).

FIG. 23 is a block diagram depicting an example of schematic configuration of a vehicle control system.

FIG. 24 is a diagram of assistance in explaining an example of installation positions of an outside-vehicle information detecting section and an imaging section.

MODES FOR CARRYING OUT THE INVENTION

The following describes an embodiment of the present disclosure in detail with reference to the drawings. The following description is a specific example of the present disclosure, but the present disclosure is not limited to the following mode. In addition, the present disclosure does not limit the disposition, dimensions, dimension ratios, and the like of respective components illustrated in the respective diagrams thereto. It is to be noted that description is given in the following order.

1. First Embodiment (an example in which a side surface of a through hole having a through electrode formed on and in a light receiving surface is provided with a dielectric film having greater film thickness on the light receiving surface than the side surface of the through hole)
1-1. Configuration of Imaging Element
1-2. Method of Manufacturing Imaging Element
1-3. Workings and Effects
2. Second Embodiment (an example in which two organic photoelectric converters are stacked on a semiconductor substrate)
3. Third Embodiment (an example in which a lower electrode includes an organic photoelectric converter formed by using a solid film)
4. Modification Examples
4-1. Modification Example 1 (an example in which a dielectric film in a predetermined region on a light receiving surface is increased in thickness by separately forming a dielectric film on a portion of the light receiving surface)
4-2. Modification Example 2 (an example in which a through electrode is provided in a peripheral region)
5. Application Examples

1. First Embodiment

FIG. 1 illustrates a cross-sectional configuration of an imaging element (imaging element 10A) according to a first embodiment of the present disclosure. FIG. 2 illustrates a planar configuration of the imaging element 10A illustrated in FIG. 1. FIG. 3 is an equivalent circuit diagram of the imaging element 10A illustrated in FIG. 1. This corresponds to a region 100 illustrated in FIG. 2. FIG. 4 schematically illustrates the disposition of a lower electrode 21 and a transistor included in a control section of the imaging element 10A illustrated in FIG. 1. The imaging element 10A is included, for example, in one pixel (unit pixel P) in an imaging device such as a CMOS (Complementary Metal Oxide Semiconductor) image sensor (imaging device 1; see FIG. 18) included in an electronic apparatus such as a digital still camera or a video camera.

The imaging element 10A according to the present embodiment has a dielectric film 26 formed on a light receiving surface (one surface; first surface (surface 30S1)) of a semiconductor substrate 30 and the side surface of a through hole 30H. The through hole 30H penetrates between the first surface (surface 30S1) and a second surface (surface 30S2) of the semiconductor substrate 30. A through electrode 34 is formed inside the through hole 30H. The film thickness of the dielectric film 26 varies between the first surface (surface 30S1) of the semiconductor substrate 30 and the side surface of the through hole 30H. This dielectric film 26 is provided on the first surface (surface 30S1) of the semiconductor substrate 30. The dielectric film 26 includes a first dielectric film 26a having first film thickness and a second dielectric film 26b provided on the side surface of the through hole 30H. The first film thickness is greater than second film thickness. That is, the imaging element 10A has the dielectric film 26 formed therein to cause the dielectric film 26 to be thicker on the first surface (surface 30S1) side of the semiconductor substrate 30 than on the side surface side of the through hole 30H. The dielectric film 26 is provided over the side surface of the through hole 30H having the through electrode 34 therein from the first surface (surface 30S2) serving as a light receiving surface.

1-1. Configuration of Imaging Element

The imaging element 10A is, for example, a so-called vertical spectroscopic imaging element in which one organic photoelectric converter 20 and two inorganic photoelectric converters 32B and 32R are stacked in the vertical direction. The organic photoelectric converter 20 is provided on the first surface (back surface; surface 30S1) side of the semiconductor substrate 30. The inorganic photoelectric converters 32B and 32R are formed to be embedded in the semiconductor substrate 30 and stacked in the thickness direction of the semiconductor substrate 30. The organic photoelectric converter 20 includes a photoelectric conversion layer 24 between the lower electrode 21 (first electrode) and an upper electrode 25 (second electrode). The lower electrode 21 (first electrode) and the upper electrode 25 (second electrode) are disposed to be opposed to each other. The photoelectric conversion layer 24 is formed by using an organic material. This photoelectric conversion layer 24 includes a p-type semiconductor and an n-type semiconductor and has a bulk heterojunction structure in the layer. The bulk heterojunction structure is a p/n junction surface formed by mixing the p-type semiconductor and the n-type semiconductor.

The lower electrode 21 of the organic photoelectric converter 20 according the present embodiment includes a plurality of electrodes (readout electrode 21A and accumulation electrode 21B). The organic photoelectric converter 20 according the present embodiment includes an insulating layer 22 and a semiconductor layer 23 in order between these lower electrode 21 and photoelectric conversion layer 24. The insulating layer 22 is provided with an opening 42H above the readout electrode 21A and the readout electrode 21A is electrically coupled to the semiconductor layer 23 via this opening 22H.

The organic photoelectric converter 20 and the inorganic photoelectric converters 32B and 32R perform photoelectric conversion by selectively detecting the respective pieces of light in different wavelength ranges. Specifically, for example, the organic photoelectric converter 20 acquires a color signal of green (G). The inorganic photoelectric converters 32B and 32R respectively acquire a color signal of blue (B) and a color signal of red (R) by using different absorption coefficients. This enables the imaging element 10A to acquire a plurality of types of color signals in one pixel without using color filters.

It is to be noted that, in the present embodiment, description is given of a case of reading the electron of a pair (electron-hole pair) of the electron and hole generated from photoelectric conversion as a signal charge (case where the n-type semiconductor region is used as a photoelectric conversion layer). In addition, in the diagram, "+(plus)" attached to "p" and "n" indicates high p-type or n-type impurity concentration.

The second surface (front surface; 30S2) of the semiconductor substrate 30 is provided, for example, with floating diffusions (floating diffusion layers) FD1 (region 36B in the semiconductor substrate 30), FD2 (region 37C in the semiconductor substrate 30), and FD3 (region 38C in the semiconductor substrate 30), transfer transistors Tr2 and Tr3, an amplifier transistor (modulation element) AMP, a reset transistor RST, a selection transistor SEL, and a multilayer wiring line 40. The multilayer wiring line 40 has a configuration in which wiring layers 41, 42, and 43 are, for example, stacked in an insulating layer 44.

It is to be noted that the first surface (surface 30S1) side of the semiconductor substrate 30 is referred to as light incidence side S1 and the second surface (surface 30S2) side is referred to as wiring layer side S2 in the diagrams.

The organic photoelectric converter 20 has a configuration in which, for example, the lower electrode 21, the semiconductor layer 23, the photoelectric conversion layer 24, and the upper electrode 25 are stacked in this order from the first surface (surface 30S1) side of the semiconductor substrate 30. In addition, the insulating layer 22 is provided between the lower electrode 21 and the semiconductor layer 23. For example, the lower electrodes 21 are formed separately for the respective imaging elements 10A. The lower electrodes 21 each include the readout electrode 21A and the accumulation electrode 21B that are separated from each other with the insulating layer 22 interposed therebetween, although described below in detail. The readout electrode 21A of the lower electrode 21 is electrically coupled to the semiconductor layer 23 via the opening 22H provided in the insulating layer 22. FIG. 1 illustrates an example in which the semiconductor layer 23, the photoelectric conversion layer 24, and the upper electrode 25 are provided as continuous layers common to the plurality of imaging elements 10A, but the semiconductor layers 23, the photoelectric conversion layers 24, and the upper electrodes 25 may be separately formed for the respective imaging elements 10A. For example, the dielectric film 26, an insulating film 27, and an interlayer insulating layer 28 are provided between the first surface (surface 30S1) of the semiconductor substrate 30 and the lower electrode 21. There is provided a protective layer 51 on the upper electrode 25. There is provided a light-shielding film 52 inside the protective layer 51, for example, above the readout electrode 21A. It is sufficient if this light-shielding film 52A is provided to cover the region of the readout electrode 21A in direct contact with at least the semiconductor layer 23 without overlapping with at least the accumulation electrode 21B. Optical members such as a planarization layer (not illustrated) and an on-chip lens 53 are disposed above the protective layer 51.

The through electrode 34 is provided between the first surface (surface 30S1) and the second surface (surface 30S2) of the semiconductor substrate 30. This through electrode 34 is electrically coupled to the readout electrode 21A of the organic photoelectric converter 20. The organic photoelectric converter 20 is coupled to a gate Gamp of the amplifier transistor AMP and the one source/drain region 36B of the reset transistor RST (reset transistor Tr1rst) also serving as the floating diffusion FD1 via the through electrode 34. This allows the imaging element 10A to favorably transfer charges (electrons here) generated in the organic photoelectric converter 20 on the first surface (surface 30S21) side of the semiconductor substrate 30 to the second surface (surface 30S2) side of the semiconductor substrate 30, thereby increasing characteristics.

The lower end of the through electrode 34 is coupled to a coupling section 41A in the wiring layer 41. The coupling section 41A and the gate Gamp of the amplifier transistor AMP are coupled via a lower first contact 45. The coupling section 41A and the floating diffusion FD1 (region 36B) are coupled, for example, via a lower second contact 46. The upper end of the through electrode 34 is coupled to the readout electrode 21A, for example, via an upper first contact 29A, a pad section 39A, and an upper second contact 29B.

The through electrode 34 is provided for each of the organic photoelectric converters 20 in the respective imaging elements 10A. The through electrode 34 has a function of a connector for the organic photoelectric converter 20 and the gate Gamp of the amplifier transistor AMP and the floating diffusion FD1. The through electrode 34 serves as a transmission path for charges (electrons here) generated in the organic photoelectric converter 20.

A reset gate Grst of the reset transistor RST is disposed next to the floating diffusion FD1 (one source/drain region 36B of the reset transistor RST). This allows the reset transistor RST to reset the charges accumulated in the floating diffusion FD1.

In the imaging element 10A according to the present embodiment, light entering the organic photoelectric converter 20 from the upper electrode 25 side is absorbed by the photoelectric conversion layer 24. The excitons generated by this each move to the interface between an electron donor and an electron acceptor included in the photoelectric conversion layer 24 and undergoes exciton dissociation. In other words, the exciton is separated into an electron and a hole. The charges (electrons and holes) generated here are transported to different electrodes by diffusion due to a difference in concentration in the carriers and an internal electric field caused by the different work functions of the anode (upper electrode 25 here) and the cathode (lower electrode 21 here). The transported charges are detected as a photocurrent. In addition, the application of a potential between the lower electrode 21 and the upper electrode 25 makes it possible to control the transport direction of electrons and holes.

The following describes configurations, materials, and the like of the respective sections.

The organic photoelectric converter 20 is an organic photoelectric conversion element that absorbs green light corresponding to a portion or all of a selective wavelength range (e.g., 450 nm or more and 650 nm or less) and generates electron-hole pairs.

As described above, the lower electrode 21 includes the readout electrode 21A and the accumulation electrode 21B that are formed separately. The readout electrode 21A transfers charges (electrons here) generated in the photoelectric conversion layer 24 to the floating diffusion FD1. For example, the readout electrode 21A is coupled to the floating diffusion FD1 via the upper first contact 29A, the upper second contact 29B, the pad section 39A, the through electrode 34, the coupling section 41A, and a lower second contact 4. The accumulation electrode 21B is for accumulating the electrons of the charges generated in the photoelectric conversion layer 24 in the semiconductor layer 23 as signal charges. The accumulation electrode 21B is provided in a region that is opposed to the light receiving surfaces of the inorganic photoelectric converters 32B and 32R formed in the semiconductor substrate 30 and covers these light receiving surfaces. It is desirable that the accumulation electrode 21B be larger than the readout electrode 21A. This allows the accumulation electrode 21B to accumulate a large number of charges. As illustrated in FIG. 4, a voltage application circuit 60 is coupled to the accumulation electrode 21B via a wiring line.

The lower electrode 21 includes an electrically conducive film having light transmissivity. The lower electrode 21 includes, for example, ITO (indium-tin oxide). However, in addition to ITO, a tin oxide ($SnO_2$)-based material to which a dopant is added or a zinc oxide-based material prepared by adding a dopant to a zinc oxide (ZnO) may be used as a material included in the lower electrode 21. Examples of the zinc oxide-based materials include aluminum zinc oxide (AZO) to which aluminum (Al) is added as a dopant, gallium (Ga)-added gallium zinc oxide (GZO), and indium (In)-added indium zinc oxide (IZO). In addition to these, CuI, $InSbO_4$, ZnMgO, $CuInO_2$, $MgIN_2O_4$, CdO, $ZnSnO_3$, and the like may also be used.

The semiconductor layer 23 is provided in a lower layer of the photoelectric conversion layer 24, specifically, between the insulating layer 22 and the photoelectric conversion layer 24. The semiconductor layer 23 is for accumulating signal charges (electrons here) generated in the photoelectric conversion layer 24. It is preferable that the semiconductor layer 23 be formed by using a material having higher charge mobility and having a larger band gap than that of the photoelectric conversion layer 24. For example, it is preferable that the band gap of a material included in the semiconductor layer 23 be 3.0 eV or more. Examples of such a material include an oxide semiconductor material such as IGZO, an organic semiconductor material, and the like. Examples of the organic semiconductor material include transition metal dichalcogenide, silicon carbide, diamond, graphene, a carbon nanotube, a fused polycyclic hydrocarbon compound, a fused heterocyclic compound, and the like. The semiconductor layer 23 has a thickness of 10 nm or more and 300 nm or less, for example. The semiconductor layer 23 including the above-described materials is disposed in a lower layer of the photoelectric conversion layer 24. This makes it possible to prevent the charges from being recombined during the charge accumulation period and increase the transfer efficiency.

The photoelectric conversion layer 24 converts light energy to electric energy. The photoelectric conversion layer 24 includes, for example, two or more types of organic semiconductor materials (p-type semiconductor material or n-type semiconductor material) that each function as a p-type semiconductor or an n-type semiconductor. The photoelectric conversion layer 24 includes, in the layer, the junction surface (p/n junction surface) between these p-type semiconductor material and n-type semiconductor material. The p-type semiconductor relatively functions as an electron donor (donor) and the n-type semiconductor relatively functions an electron acceptor (acceptor). The photoelectric conversion layer 24 provides a field in which excitons generated when absorbing light are separated into electrons and holes. Specifically, excitons are separated into electrons and holes at the interface (p/n junction surface) between the electron donor and the electron acceptor.

The photoelectric conversion layer 24 may include an organic material or a so-called dye material in addition to the p-type semiconductor material and the n-type semiconductor material. The organic material or dye material photoelectrically converts light in a predetermined wavelength range and transmits light in another wavelength range. In a case where the photoelectric conversion layer 24 is formed by using the three types of organic materials of a p-type semiconductor material, an n-type semiconductor material, and a dye material, it is preferable that the p-type semiconductor material and the n-type semiconductor material be materials each having light transmissivity in a visible region (e.g., 450 nm to 800 nm). The photoelectric conversion layer 24 has a thickness of 50 nm to 500 nm, for example.

Examples of the organic materials included in the photoelectric conversion layer 24 include quinacridone, boron chloride subphthalocyanine, pentacene, benzothienobenzothiophene, fullerene, and derivatives thereof. The photoelectric conversion layer 24 includes a combination of the above-described two or more types of organic materials. The above-described organic materials function as a p-type semiconductor or an n-type semiconductor depending on the combination.

It is to be noted that the organic materials included in the photoelectric conversion layer 24 are not particularly limited. For example, any one of naphthalene, anthracene, phenantherene, tetracene, pyrene, perylene, and fluoranthene or derivatives thereof is favorably used in addition to the organic materials listed above. Alternatively, a polymer such as phenylenevinylene, fluorene, carbazole, indole, pyrene, pyrrole, picoline, thiophene, acetylene, and diacetylene or a derivative thereof may be used. Additionally, it is possible to favorably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and croconic methine group as a bonded chain, or by a squarylium group or a croconic methine group, etc. It is to be noted that the above-described metal complex dye is preferably, but not limited to, a dithiol metal complex-based dye, a metallophthalocyanine dye, a metalloporphyrine dye, or a ruthenium complex dye.

There may be provided other layers between the photoelectric conversion layer 24 and the lower electrode 21 (e.g., between the semiconductor layer 23 and the photoelectric conversion layer 24) and between the photoelectric conversion layer 24 and the upper electrode 25. Specifically, for example, the semiconductor layer 23, an electron blocking film, the photoelectric conversion layer 24, a hole blocking film, a work function adjustment film, and the like may be stacked in order from the lower electrode 21 side. Further, there may be provided an underlying layer and a hole transfer layer between the lower electrode 21 and the photoelectric conversion layer 24 and there may be provided a buffer layer and an electron transfer layer between the photoelectric conversion layer 24 and the upper electrode 25.

The upper electrode 25 includes an electrically conductive film having light transmissivity as with the lower electrode 21. In the imaging device 1 including the imaging element 10A as one pixel, the upper electrodes 25 may be separated for the respective pixels or formed as an electrode common to the respective pixels. The upper electrode 25 has a thickness of 10 nm to 200 nm, for example.

The dielectric film 26 is for preventing the reflection of light caused by a refractive index difference between the semiconductor substrate 30 and the insulating film 27. It is preferable that a material of the dielectric film 26 be a material having a refractive index between the refractive index of the semiconductor substrate 30 and the refractive index of the insulating film 27. Further, it is preferable that a material allowing a film to be formed having, for example, a negative fixed charge be used as a material of the dielectric film 26. Alternatively, it is preferable that a semiconductor material or an electrically conductive material having a wider band gap than that of the semiconductor substrate 30 be used as a material of the dielectric film 26. This makes it possible to suppress the generation of dark currents at the interface of the semiconductor substrate 30. Examples of such materials include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxynitride ($HfO_x N_y$), aluminum oxynitride ($AlO_x N_y$), and the like.

As described above, the dielectric film 26 includes the first dielectric film 26a and the second dielectric film 26b. The first dielectric film 26a is provided on the first surface (surface 30S1) of the semiconductor substrate 30 and has first film thickness W1. The second dielectric film 26b is provided on the side surface of the through hole 30H and has second film thickness W2. The first dielectric film 26a on the first surface (surface 30S1) of the semiconductor substrate 30 has film thickness (first film thickness: W1) greater than the film thickness (second film thickness: W2) of the second dielectric film 26b formed on the side surface of the through hole 30H. Specifically, for example, it is preferable that the first dielectric film 26a have a film thickness of 10 nm or more and 500 nm or less, for example, in a case where the imaging element 10A is an imaging element for visible light. It is preferable that the second dielectric film 26b have a film thickness of 1 nm or more and 200 nm or less, for example. It is preferable that the first dielectric film 26a have a film thickness of 10 nm or more and 1000 nm or less, for example, in a case where the imaging element 10A is an imaging element for infrared light. It is preferable that the second dielectric film 26b have a film thickness of 1 nm or more and 200 nm or less, for example. This makes it possible to suppress the reflection of incident light on the light receiving surface (first surface (surface 30S1)) of the semiconductor substrate 30 while suppressing an increase in the capacitance of the through electrode 34 provided inside the through hole 30H.

For example, as illustrated in FIG. 5A, the first dielectric film 26a of the dielectric film 26 on the semiconductor substrate 30 and the second dielectric film 26b of the dielectric film 26 formed on the side surface of the through hole 30H may be formed as single-layer films, but this is not limitative.

For example, as illustrated in FIG. 5B, the first dielectric film 26a having greater film thickness than that of the second dielectric film 26b on the side surface of the through hole 30H may be formed by forming the dielectric film 26 as a partially stacked film of a dielectric film 26A and a dielectric film 26B. The dielectric film 26A is formed as a continuous film having uniform film thickness from the first surface (surface 30S1) of the semiconductor substrate 30 to the side surface of the through hole 30H. The dielectric film 26B is formed only on the dielectric film 26A on the first surface (surface 30S1) of the semiconductor substrate 30.

For example, as illustrated in FIG. 5C, the dielectric film 26 may be formed to have greater film thickness on the first surface (surface 30S1) of the semiconductor substrate 30 than on the side surface of the through hole 30H by forming the entire dielectric film 26 as a stacked film (dielectric films 26A and 26B) and forming first dielectric films 26a1 and 26a2 on the semiconductor substrate 30 to be greater in film thickness than second dielectric films 26b1 and 26b2 formed on the side surface of the through hole 30H.

It is to be noted that FIGS. 5B and 5C each illustrate an example in which the two dielectric films 26 are stacked as a stacked film, but three or more films may also be stacked. For example, the three first dielectric films 26a and the one second dielectric film 26b may be stacked or the three first dielectric films 26a and the two second dielectric films 26b may be stacked. In addition, as described above, in a case where the dielectric films 26 are formed as a stacked film, the same materials may be used to form the dielectric films 26 or different materials may be used to form the dielectric films 26. The first dielectric film 26a having two or more types of films stacked is provided on the first surface (surface 30S1) of the semiconductor substrate 30 in this way. This makes it possible to add the performance of a hole accumulation layer. Further, as described above, it is preferable that the dielectric film 26 have a refractive index that gradually comes closer to the refractive index of the semiconductor substrate 30 from the insulating film 27 side to the semiconductor substrate 30 side in a case where the dielectric film 26 is formed as a stacked film. This makes it possible to suppress the reflection of incident light at the interface of the semiconductor substrate 30, facilitate incident light to enter the semiconductor substrate 30, and increase the photoelectric conversion efficiency of the inorganic photoelectric converters 32B and 32R that are formed to be embedded.

In addition, although described below in detail, for example, dry etching is used as a method of forming the through hole 30H in the semiconductor substrate 30. In that case, the upper portion of the through hole 30H or the region near the first surface (surface 30S1) of the semiconductor substrate 30 has great damage. It is therefore preferable that the dielectric film 26A be formed at the upper portion of the through hole 30H as illustrated in FIG. 5D, the dielectric film 26B be then formed that extends from above the first surface (surface 30S1) of the semiconductor substrate 30 to the upper portion of the side surface of the through hole 30H and the second dielectric film 26b be formed to have increased film thickness at the upper portion of the side surface of the through hole 30H. The dielectric film 26A is a continuous film having uniform film thickness from the first surface (surface 30S1) of the semiconductor substrate 30 to the side surface of the through hole 30H.

It is to be noted that an insulating film such as an oxide film may be formed between the semiconductor substrate 30 and the dielectric film 26.

The insulating film 27 is provided on the first dielectric film 26a formed on the first surface (surface 30S1) of the semiconductor substrate 30 and between the second dielectric film 26b formed on the side surface of the through hole 30H and the through electrode 34. The insulating film 27 is for electrically insulating the through electrode 34 and the semiconductor substrate 30. A material of the insulating film 27 is not particularly limited, but the insulating film 27 is formed by using, for example, silicon oxide ($SiO_x$), TEOS, silicon nitride ($SiN_x$), silicon oxynitride (SiON), and the like.

The interlayer insulating layer 28 includes, for example, a single-layer film including one of silicon oxide ($SiO_x$), TEOS, silicon nitride ($SiN_x$), silicon oxynitride (SiON), and the like or a stacked film including two or more of them.

The insulating layer 22 is for electrically separating the accumulation electrode 21B and the semiconductor layer 23. The insulating layer 22 is provided, for example, on the interlayer insulating layer 28 to cover the lower electrode 21. In addition, the insulating layer 22 is provided with an opening 22H on the readout electrode 21A of the lower electrode 21. The readout electrode 21A and the semiconductor layer 23 are electrically coupled via this opening 22H. It is possible to form the insulating layer 22 by using, for example, a material similar to that of the interlayer insulating layer 28. The insulating layer 22 includes, for example, a single-layer film including one of silicon oxide ($SiO_x$), silicon nitride ($SiN_x$), silicon oxynitride (SiON), and the like or a stacked film including two or more of them. The insulating layer 22 has a thickness of 20 nm to 500 nm, for example.

The protective layer 51 includes a material having light transmissivity. The protective layer 51 includes, for example, a single-layer film including any of silicon oxide, silicon nitride, silicon oxynitride, and the like or a stacked film including two or more of them. This protective layer 51 has a thickness of 100 nm to 30000 nm, for example.

The semiconductor substrate 30 includes, for example, an n-type silicon (Si) substrate and has a p well 31 in a predetermined region (e.g., pixel section 1a). The second surface (surface 30S2) of the p well 31 is provided with the above-described transfer transistors Tr2 and Tr3, amplifier transistor AMP, reset transistor RST, selection transistor SEL, and the like. In addition, a peripheral section (peripheral section 1b) of the semiconductor substrate 30 is provided as illustrated in FIG. 2, for example, with a pixel readout circuit 110 and a pixel drive circuit 120 each including a logic circuit or the like.

The reset transistor RST (reset transistor Tr1rst) resets charges transferred to the floating diffusion FD1 from the organic photoelectric converter 20 and includes, for example, a MOS transistor. Specifically, the reset transistor Tr1rst includes the reset gate Grst, a channel formation region 36A, and the source/drain regions 36B and 36C. The reset gate Grst is coupled to a reset line RST1. The one source/drain region 36B of the reset transistor Tr1rst also serves as the floating diffusion FD1. The other source/drain region 36C included in the reset transistor Tr1rst is coupled to a power supply VDD.

The amplifier transistor AMP is a modulation element that modulates the amount of charges generated in the organic photoelectric converter 20 to a voltage. The amplifier transistor AMP includes, for example, a MOS transistor. Specifically, the amplifier transistor AMP includes the reset gate Gamp, a channel formation region 35A, and source/drain regions 35B and 35C. The gate Gamp is coupled to the readout electrode 21A and the one source/drain region 36B (floating diffusion FD1) of the reset transistor Tr1rst via the lower first contact 45, the coupling section 41A, the lower second contact 46, the through electrode 34, and the like. In addition, the one source/drain region 35B shares a region with the other source/drain region 36C included in the reset transistor Tr1rst and is coupled to the power supply VDD.

The selection transistor SEL (selection transistor TR1sel) includes a gate Gsel, a channel formation region 34A, and source/drain regions 34B and 34C. The gate Gsel is coupled to a selection line SELL In addition, the one source/drain region 34B shares a region with the other source/drain region 35C included in the amplifier transistor AMP and the other source/drain region 34C is coupled to a signal line (data output line) VSL1.

The inorganic photoelectric converters 32B and 32R each have a pn junction in a predetermined region of the semiconductor substrate 30. The inorganic photoelectric converters 32B and 32R each allow light to be dispersed in the vertical direction because pieces of light different in wavelength are absorbed in accordance with the light incidence depth in a silicon substrate. The inorganic photoelectric converter 32B selectively detects blue light to accumulate signal charges corresponding to a blue color. The inorganic photoelectric converter 32B is installed at depth at which it is possible to photoelectrically convert blue light efficiently. The inorganic photoelectric converter 32R selectively detects red light to accumulate signal charges corresponding to a red color. The inorganic photoelectric converter 32R is installed at depth at which it is possible to photoelectrically convert red light efficiently. It is to be noted that blue (B) is a color corresponding to a wavelength range of 450 nm to 495 nm, for example. Red (R) is a color corresponding to a wavelength range of 620 nm to 750 nm, for example. It is sufficient if the inorganic photoelectric converters 32B and 32R are configured to detect light in a portion or all of the respective wavelength ranges.

The inorganic photoelectric converter 32B includes, for example, a p+ region serving as a hole accumulation layer and an n region serving as an electron accumulation layer. The inorganic photoelectric converter 32R includes, for example, a p+ region serving as a hole accumulation layer and an n region serving as an electron accumulation layer (having a p-n-p stacked structure). The n region of the inorganic photoelectric converter 32B is coupled to the vertical transfer transistor Tr2. The p+ region of the inorganic photoelectric converter 32B is bent along the transfer transistor Tr2 and leads to the p+ region of the inorganic photoelectric converter 32R.

The transfer transistor Tr2 (transfer transistor TR2trs) is for transferring, to the floating diffusion FD2, signal charges (electrons here) corresponding to the blue color generated and accumulated in the inorganic photoelectric converter 32B. The inorganic photoelectric converter 32B is formed at a deep position from the second surface (surface 30S2) of the semiconductor substrate 30 and it is thus preferable that the transfer transistor TR2trs of the inorganic photoelectric converter 32B include a vertical transistor. In addition, the transfer transistor TR2trs is coupled to a transfer gate line TG2. Further, the floating diffusion FD2 is provided in the region 37C near a gate Gtrs2 of the transfer transistor TR2trs. The charges accumulated in the inorganic photoelectric converter 32B are read out by the floating diffusion FD2 via a transfer channel formed along the gate Gtrs2.

The transfer transistor Tr3 (transfer transistor TR3trs) transfers, to the floating diffusion FD3, signal charges (electrons here) corresponding to the red color generated and accumulated in the inorganic photoelectric converter 32R. The transfer transistor Tr3 (transfer transistor TR3trs) includes, for example, a MOS transistor. In addition, the transfer transistor TR3trs is coupled to a transfer gate line TG3. Further, the floating diffusion FD3 is provided in the region 38C near a gate Gtrs3 of the transfer transistor TR3trs. The charges accumulated in the inorganic photoelectric converter 32R are read out by the floating diffusion FD3 via a transfer channel formed along the gate Gtrs3.

There are further provided a reset transistor TR2rst, an amplifier transistor TR2amp, and a selection transistor TR2sel on the second surface (surface 30S2) side of the semiconductor substrate 30. The reset transistor TR2rst, the amplifier transistor TR2amp, and the selection transistor TR2sel are included in the control section of the inorganic photoelectric converter 32B. In addition, there are provided a reset transistor TR3rst, an amplifier transistor TR3amp, and a selection transistor TR3sel that are included in the control section of the inorganic photoelectric converter 32R.

The reset transistor TR2rst includes a gate, a channel formation region, and a source/drain region. The gate of the reset transistor TR2rst is coupled to a reset line RST2 and one source/drain region of the reset transistor TR2rst is coupled to the power supply VDD. The other source/drain region of the reset transistor TR2rst also serves as the floating diffusion FD2.

The amplifier transistor TR2amp includes a gate, a channel formation region, and a source/drain region. The gate is coupled to the other source/drain region (floating diffusion FD2) of the reset transistor TR2rst. In addition, the one source/drain region included in the amplifier transistor TR2amp shares a region with the one source/drain region included in the reset transistor Tr2rst and is coupled to the power supply VDD.

The selection transistor TR2sel includes a gate, a channel formation region, and a source/drain region. The gate is coupled to a selection line SEL2. In addition, the one source/drain region included in the selection transistor TR2sel shares a region with the other source/drain region included in the amplifier transistor Tr2amp. The other source/drain region included in the selection transistor TR2sel is coupled to a signal line (data output line) VSL2.

The reset transistor TR3rst includes a gate, a channel formation region, and a source/drain region. The gate of the reset transistor TR3rst is coupled to a reset line RST3 and one source/drain region included in the reset transistor TR3rst is coupled to the power supply VDD. The other source/drain region included in the reset transistor TR3rst also serves as the floating diffusion FD3.

The amplifier transistor TR3amp includes a gate, a channel formation region, and a source/drain region. The gate is coupled to the other source/drain region (floating diffusion FD3) included in the reset transistor TR3rst. In addition, the one source/drain region included in the amplifier transistor TR3amp shares a region with the one source/drain region included in the reset transistor Tr3rst and is coupled to the power supply VDD.

The selection transistor TR3sel includes a gate, a channel formation region, and a source/drain region. The gate is coupled to a selection line SEL3. In addition, the one source/drain region included in the selection transistor TR3sel shares a region with the other source/drain region included in the amplifier transistor Tr3amp. The other source/drain region included in the selection transistor TR3sel is coupled to a signal line (data output line) VSL3.

The reset lines RST1, RST2, and RST3, the selection lines SEL1, SEL2, and SEL3, and the transfer gate lines TG2 and TG3 are each coupled to a vertical drive circuit 112 included in a drive circuit. The signal lines (data output lines) VSL1, VSL2, and VSL3 are coupled to a column signal processing circuit 113 included in the drive circuit.

The lower first contact 45, the lower second contact 46, the upper first contact 29A, the upper second contact 29B, and an upper third contact 29C each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

1-2. Method of Manufacturing Imaging Element

It is possible to manufacture the imaging element 10A according to the present embodiment, for example, as follows.

FIGS. 6 to 11 illustrate the method of manufacturing the imaging element 10A in order of steps. First, as illustrated in FIG. 6, for example, the p well 31 is formed as a well of a first electrical conduction type in the semiconductor substrate 30. The inorganic photoelectric converters 32B and 32R of a second electrical conduction type (e.g., n-type) are formed in this p well 31. A p+ region is formed in a region near the first surface (surface 30S1) of the semiconductor substrate 30.

As also illustrated in FIG. 6, for example, n+ regions that serve as the floating diffusions FD1 to FD3 are formed on the second surface (surface 30S2) of the semiconductor substrate 30 and a gate insulating layer 33 and a gate wiring layer 47 are then formed. The gate wiring layer 47 includes the respective gates of the transfer transistor Tr2, the transfer transistor Tr3, the selection transistor SEL, the amplifier transistor AMP, and the reset transistor RST. This forms the transfer transistor Tr2, the transfer transistor Tr3, the selection transistor SEL, the amplifier transistor AMP, and the reset transistor RST. Further, the multilayer wiring line 40 is formed on the second surface (surface 30S2) of the semiconductor substrate 30. The multilayer wiring line 40 includes the wiring layers 41 to 43 and the insulating layer 44. The wiring layers 41 to 43 include the lower first contact 45, the lower second contact 46, and the coupling section 41A.

As the base of the semiconductor substrate 30, for example, an SOI (Silicon on Insulator) substrate is used in which the semiconductor substrate 30, an embedded oxide film (not illustrated), and a holding substrate (not illustrated) are stacked. Although not illustrated in FIG. 6, the embedded oxide film and the holding substrate are joined to the first surface (surface 30S1) of the semiconductor substrate 30. After ion implantation, annealing treatment is performed.

Next, a support substrate (not illustrated), another semiconductor base, or the like is joined to the second surface (surface 30S2) side (multilayer wiring line 40 side) of the semiconductor substrate 30 and flipped vertically. Subsequently, the semiconductor substrate 30 is separated from the embedded oxide film and the holding substrate of the SOI substrate to expose the first surface (surface 30S1) of the semiconductor substrate 30. It is possible to perform the above-described steps with technology used in a normal CMOS process such as ion implantation and CVD (Chemical Vapor Deposition).

Next, as illustrated in FIG. 7, the semiconductor substrate 30 is processed from the first surface (surface 30S1) side, for example, by dry etching to form the annular through hole 30H, for example. The depth of the through hole 30H extends as illustrated in FIG. 7 from the first surface (surface 30S1) to the second surface (surface 30S2) of the semiconductor substrate 30.

Next, as illustrated in FIG. 8, the dielectric film 26A is formed on the first surface (surface 30S1) of the semiconductor substrate 30 and the side surface of the through hole 30H by using, for example, atomic layer deposition (Atomic Layer Deposition; ALD). This forms the dielectric film 26A that is continuous over the first surface (surface 30S1) of the semiconductor substrate 30 and the side surface and bottom surface of the through hole 30H. Next, the dielectric film 26B is formed on the dielectric film 26A on the first surface (surface 30S1) of the semiconductor substrate 30 by using, for example, sputtering and the insulating film 27 is then formed above the first surface (surface 30S1) of the insulating film 27 is then formed above the first surface (surface 30S1) of the semiconductor substrate 30 and inside the through hole 30H.

Next, as illustrated in FIG. 9, a through hole 27H is formed, for example, by dry etching in the insulating film 27 formed inside the through hole 30H. The through hole 27H reaches the coupling section 41A through the insulating film 27, the first dielectric film 26a, and the insulating layer 44. It is to be noted that the insulating film 27 above the first surface (surface 30S1) is also decreased in thickness in this case.

Next, as illustrated in FIG. 10, an electrically conducive film 34x is formed on the insulating film 27 and inside the through hole 27H and a photoresist PR is then formed at a predetermined position on the electrically conducive film 34x. Afterward, the through electrode 34 illustrated in FIG. 11 that includes a protruding section on the first surface (surface 30S1) of the semiconductor substrate 30 is formed by etching and removing the photoresist PR.

Afterward, an insulating film included in the interlayer insulating layer 28 is formed on an insulating film 37 and the through electrode 34, the upper first contact 29A, the pad sections 39A and 39B, the upper second contact 29B, and the upper third contact 29C are formed on the through electrode 34 and the like, and the surface of the interlayer insulating layer 28 is planarized by using CMP (Chemical Mechanical Polishing). Subsequently, an electrically conductive film is formed on the interlayer insulating layer 28 and a photoresist is then formed at a predetermined position on the electrically conducive film. Afterward, the readout electrode 21A and the accumulation electrode 21B are formed by etching and removing the photoresist. Next, the insulating layer 22 is formed on the interlayer insulating layer 28 and the readout electrode 21A and the accumulation electrode 21B and the opening 22H is then provided on the readout electrode 21A. Subsequently, the semiconductor layer 23, the photoelectric conversion layer 24, the upper electrode 25, the protective layer 51, and the light-shielding film 52 are formed on the insulating layer 22. It is to be noted that, in a case where the semiconductor layer 23 and another organic layer are formed by using organic materials, it is preferable that the semiconductor layer 23 and the other organic layer be formed continuously (in an in-situ vacuum process) in a vacuum step. In addition, the method of forming the photoelectric conversion layer 24 is not necessarily limited to a method in which vacuum evaporation is used. Another method, for example, spin coating technology, printing technology, or the like may be used. Finally, the protective layer 51, the light-shielding film 52, and the on-chip lens 53 are disposed. As described above, the imaging element 10A illustrated in FIG. 1 is completed.

When light enters the organic photoelectric converter 20 via the on-chip lens 53 in the imaging element 10A, the light passes through the organic photoelectric converter 20 and the inorganic photoelectric converters 32B and 32R in order. While the light passes through the organic photoelectric converter 20 and the inorganic photoelectric converters 32B and 32R, the light is photoelectrically converted for each of green light, blue light, and red light. The following describes an operation of acquiring signals of the respective colors.

(Acquisition of Green Color Signal by Organic Photoelectric Converter 20)

First, green light of the pieces of light having entered the imaging element 10A is selectively detected (absorbed) by the organic photoelectric converter 20 to be subjected to photoelectric conversion.

The organic photoelectric converter 20 is coupled to the gate Gamp of the amplifier transistor AMP and the floating diffusion FD1 via the through electrode 34. Thus, the electrons of the electron-hole pairs generated in the organic photoelectric converter 20 are taken out from the lower electrode 21 side, transferred to the second surface (surface 30S2) side of the semiconductor substrate 30 via the through electrode 34, and accumulated in the floating diffusion FD1. At the same time as this, the amplifier transistor AMP modulates the amount of charges generated in the organic photoelectric converter 20 to a voltage.

In addition, the reset gate Grst of the reset transistor RST is disposed next to the floating diffusion FD1. This causes the reset transistor RST to reset the charges accumulated in the floating diffusion FD1.

Here, the organic photoelectric converter 20 is coupled to not only the amplifier transistor AMP, but also the floating diffusion FD1 via the through electrode 34, allowing the reset transistor RST to easily reset the charges accumulated in the floating diffusion FD1.

In contrast, in a case where the through electrode 34 and the floating diffusion FD1 are not coupled, it is difficult to reset the charges accumulated in the floating diffusion FD1, resulting in application of a large voltage to pull out the charges to the upper electrode 25 side. The photoelectric conversion layer 24 may be thus damaged. In addition, a structure that enables resetting in a short period of time leads to increased dark-time noise and results in a trade-off. This structure is thus difficult.

FIGS. 12A, 12B, and 12C illustrate an operation example of the imaging element 10A. FIG. 12A illustrates a potential at the accumulation electrode 21B, FIG. 12B illustrates a potential at the floating diffusion FD1 (readout electrode 21A), and FIG. 12C illustrates a potential at the gate (Gsel) of the reset transistor TR1rst. In the imaging element 10A, voltages are individually applied to the readout electrode 21A and the accumulation electrode 21B.

In the imaging element 10A, in an accumulation period, the drive circuit applies a potential V1 to the readout electrode 21A and applies a potential V2 to the accumulation electrode 21B. Here, it is assumed that the potentials V1 and V2 satisfy V2>V1. This causes charges (electrons here) generated through photoelectric conversion to be attracted to the accumulation electrode 21B and accumulated in the region of the semiconductor layer 23 opposed to the accumulation electrode 21B (accumulation period). Incidentally, the potential of the region of the semiconductor layer 23 opposed to the accumulation electrode 21B has a value that is more negative with the passage of time of photoelectric conversion. It is to be noted that holes are sent from the upper electrode 25 to the drive circuit.

In the imaging element 10A, a reset operation is performed in the second portion of the accumulation period. Specifically, at timing t1, a scanning section changes the voltage of a reset signal RST from a low level to a high level. This turns on the reset transistor TR1rst in the unit pixel P. As a result, the voltage of the floating diffusion FD1 is set at a power supply voltage VDD and the voltage of the floating diffusion FD1 is reset (reset period).

After the reset operation is completed, the charges are read out. Specifically, at timing 2, the drive circuit applies a potential V3 to the readout electrode 21A and applies a potential V4 to the accumulation electrode 21B. Here, it is assumed that the potentials V3 and V4 satisfy V3<V4. This causes the charges (electrons here) accumulated in the region corresponding to the accumulation electrode 21B to be read out from the readout electrode 21A to the floating diffusion FD1. That is, the charges accumulated in the semiconductor layer 23 are read out to the control section (transfer period).

After the read operation is completed, the drive circuit applies the potential V1 to the readout electrode 21A and applies the potential V2 to the accumulation electrode 21B again. This causes charges (electrons here) generated through photoelectric conversion to be attracted to the accumulation electrode 21B and accumulated in the region of the photoelectric conversion layer 24 opposed to the accumulation electrode 21B (accumulation period). (Acquisition of Blue Color Signal and Red Color Signal by Inorganic Photoelectric Converters 32B and 32R)

Next, blue light and red light of the pieces of light having passed through the organic photoelectric converter 20 are absorbed and photoelectrically converted in order by the inorganic photoelectric converter 32B and the inorganic photoelectric converter 32R, respectively. In the inorganic photoelectric converter 32B, the electrons corresponding to the incident blue light are accumulated in an n region of the inorganic photoelectric converter 32B and the accumulated electrons are transferred to the floating diffusion FD2 by the transfer transistor Tr2. Similarly, in the inorganic photoelectric converter 32R, the electrons corresponding to the incident red light are accumulated in an n region of the inorganic photoelectric converter 32R and the accumulated electrons are transferred to the floating diffusion FD3 by the transfer transistor Tr3.

1-3. Workings and Effects

As described above, in CCD image sensors, CMOS image sensors, or the like, solid-state imaging devices are widely used that each have pixel arrangement in which primary color filters of red, green, and blue are two-dimensionally arranged, which, however, generates false colors. As a countermeasure, a structure is proposed in which photoelectric conversion regions are stacked that photoelectrically convert the respective pieces of light in red, green, and blue wavelength bands and, for example, a portion of the photoelectric conversion regions is installed above the semiconductor substrate.

In a case where the above-described structure is applied to a back-illustrated imaging element, it is conceivable, for example, to form contact sections above the back surface of the semiconductor substrate to guide signal charges generated by photoelectric converters disposed above the semiconductor substrate to the semiconductor substrate. It is not, however, possible to apply a high-temperature process to the back surface side of the semiconductor substrate. Accordingly, it is not possible to provide any pixel transistor or convert signal charges to a voltage on the back surface side. An imaging element is therefore proposed that is provided with a through electrode on the semiconductor substrate and transfers a signal charge generated by an organic photoelectric converter disposed on the back surface side of the semiconductor substrate to a pixel transistor provided on the front surface side of the semiconductor substrate via this through electrode. It is possible to share the through electrode between a plurality of pixels, but the through electrode is generally provided inside a pixel region. This requires the through electrode to be formed smaller than pixel cell size.

Incidentally, back-illuminated CIS has a charge fixing film formed on the back surface of the semiconductor substrate to suppress the generation of dark currents on the back surface of the semiconductor substrate. In addition, this charge fixing film has a refractive index closer to that of Si than that of an oxide film included in the interlayer insulating layer formed above the back surface of the semiconductor substrate. This makes it possible to add the function of an anti-reflection film.

In a case where the charge fixing film (referred to as anti-reflection film below) to which the above-described anti-reflection function is added is applied to an imaging element including a through electrode, the anti-reflection film is formed on the light incidence surface side of the semiconductor substrate and the side wall of the through electrode. The anti-reflection film provided on the light incidence surface side of the semiconductor substrate is for preventing reflection at the interface of the semiconductor substrate and fixing charges. The anti-reflection film is required to have a film thickness of several tens of nm from the perspective of reflection prevention. The anti-reflection film provided on the side surface of the through electrode is for fixing charges. The anti-reflection film is required to have a film thickness of several nm to fix charges.

Incidentally, the anti-reflection film around the through electrode may increase the capacitance of the through electrode. The capacitance of the through electrode is simply expressed as the following expressions (1) and (2). It is assumed here that two types of insulating films 1121 and 1122 are embedded between a through electrode 1110 and a semiconductor substrate (not illustrated) as illustrated in FIG. 13. In a case of a constant outer diameter (r3) and a constant inner diameter (e1), the capacitance of the through electrode 1110 increases as the embedded insulating films 1121 and 1122 each have a greater dielectric constant. The through electrode is a component of a floating diffusion FD. This decreases the conversion efficiency as the capacitance of the through electrode increases.

[Expression 1]

$$V = \int_{r_1}^{r_2} \frac{Q}{2\pi\varepsilon_1} \frac{1}{r} = \frac{Q}{2\pi}\left\{\frac{1}{\varepsilon_1}\log\frac{r_2}{r_1} + \frac{1}{\varepsilon_2}\log\frac{r_3}{r_2}\right\} \quad (1)$$

$$C = \frac{2\pi}{\left(\frac{1}{\varepsilon_1}\log\frac{r_2}{r_1} + \frac{1}{\varepsilon_2}\log\frac{r_3}{r_2}\right)} L \quad (2)$$

In contrast, in the present embodiment, the first dielectric film 26a having the first film thickness is formed on the first surface (surface 30S1) of the semiconductor substrate 30 serving as a light receiving surface and the second dielectric film 26b having the second film thickness less than the first film thickness is formed on the side surface of the through hole 30H. The through hole 30H penetrates from the first surface (surface 30S1) to the second surface (surface 30S2) of the semiconductor substrate 30. The through hole 30H has the through electrode 34 formed therein. This makes it possible to reduce the reflection of incident light on the first surface (surface 30S1) of the semiconductor substrate 30 while suppressing an increase in the capacitance on the side surface of the through hole 30H without increasing the outer diameter of the through electrode 34.

As described above, in the imaging element 10A according to the present embodiment, the first dielectric film 26a having the first film thickness is formed on the first surface (surface 30S1) of the semiconductor substrate 30 and the second dielectric film 26b having the second film thickness less than the first film thickness is formed on the side surface of the through hole 30H having the through electrode 34 formed therein. This makes it possible to reduce the reflection of incident light on the first surface (surface 30S 1) of the semiconductor substrate 30 while suppressing an increase in the capacitance on the side surface of the through hole 30H. This makes it possible to provide the imaging element 10A having high sensitivity characteristics.

Next, second and third embodiments and modification examples of the present disclosure are described. The following assigns the same signs to components similar to those in the above-described first embodiment and omits descriptions thereof as appropriate.

2. Second Embodiment

FIG. 14 illustrates a cross-sectional configuration of an imaging element (imaging element 10B) according to a second embodiment of the present disclosure. The imaging element 10B is included in one pixel (unit pixel P) in an imaging device (imaging device 1) such as a CMOS image sensor used for an electronic apparatus such as a digital still camera or a video camera, for example. In the imaging element 10B according to the present embodiment, the two organic photoelectric converters 20 and 70 and one inorganic photoelectric converter 32 are stacked in the vertical direction.

The organic photoelectric converters 20 and 70 and the inorganic photoelectric converter 32 each perform photoelectric conversion by selectively detecting the light in a wavelength range. Specifically, for example, the organic photoelectric converter 20 acquires a color signal of green (G) as in the above-described first embodiment. The organic photoelectric converter 70 acquires, for example, a color signal of red (R). The inorganic photoelectric converter 32 acquires, for example, a color signal of blue (B). This enables the imaging element 10A to acquire a plurality of types of color signals in one pixel without using color filters.

The organic photoelectric converter 70 is stacked, for example, above the organic photoelectric converter 20. As with the organic photoelectric converter 20, the organic photoelectric converter 70 has a configuration in which a lower electrode 71, a semiconductor layer 73, a photoelectric conversion layer 74, and an upper electrode 75 are stacked in this order from the first surface (surface 30S1) side of the semiconductor substrate 30. In addition, there is an insulating layer 72 between the lower electrode 71 and the semiconductor layer 73. For example, the lower electrodes 71 are formed separately for the respective imaging elements 10A. The lower electrodes 71 each include a readout electrode 71A and an accumulation electrode 71B that are separated from each other with the insulating layer 72 interposed therebetween, although described below in detail. The readout electrode 71A of the lower electrode 71 is electrically coupled to the photoelectric conversion layer 74 via an opening 72H provided in the insulating layer 72. FIG. 1 illustrates an example in which the semiconductor layers 73, the photoelectric conversion layers 74, and the upper electrodes 75 are separately formed for the respective imaging elements 10A, but the semiconductor layers 73, the photoelectric conversion layers 74, and the upper electrodes 75 may be provided, for example, as continuous layers common to the plurality of imaging elements 10A.

The photoelectric conversion layer 74 converts light energy to electric energy. As with the photoelectric conversion layer 24, the photoelectric conversion layer 74 includes two or more types of organic materials (p-type semiconductor material or n-type semiconductor material) that each function as a p-type semiconductor or an n-type semiconductor. The photoelectric conversion layer 74 may include an organic material or a so-called dye material in addition to the p-type semiconductor material and the n-type semiconductor material. The organic material or dye material photoelectrically converts light in a predetermined wavelength range and transmits light in another wavelength range. In a case where the photoelectric conversion layer 74 is formed by using the three types of organic materials of a p-type semiconductor material, an n-type semiconductor material, and a dye material, it is preferable that the p-type semiconductor material and the n-type semiconductor material be materials each having light transmissivity in a visible region (e.g., 400 nm to 700 nm). The photoelectric conversion layer 74 has a thickness of 50 nm to 500 nm, for example. Examples of dye materials used for the photoelectric conversion layer 74 include a rhodamine-based dye, a merocyanine-based dye, and the like.

There are provided two through electrodes 34X and 34Y between the first surface (surface 30S1) and the second surface (surface 30S2) of the semiconductor substrate 30.

As in the above-described first embodiment, the through electrode 34X is electrically coupled to the readout electrode 21A of the organic photoelectric converter 20. The organic photoelectric converter 20 is coupled to the gate Gamp of the amplifier transistor AMP and one source/drain region 36B1 of the reset transistor RST (reset transistor Tr1rst) also serving as the floating diffusion FD1 via the through electrode 34. The upper end of the through electrode 34X is coupled to the readout electrode 21A, for example, via the upper first contact 29A, the pad section 39A, and the upper second contact 29B.

The through electrode 34Y is electrically coupled to the readout electrode 71A of the organic photoelectric converter 70. The organic photoelectric converter 70 is coupled to the gate Gamp of the amplifier transistor AMP and one source/drain region 36B2 of the reset transistor RST (reset transistor Tr2rst) also serving as the floating diffusion FD2 via the through electrode 34Y. The upper end of the through electrode 34Y is coupled to the readout electrode 71A, for example, via an upper fourth contact 79A, a pad section 69A, an upper fifth contact 79B, a pad section 69B, and an upper sixth contact 79C. In addition, a pad 69C is coupled to the accumulation electrode 71B of the lower electrode 71 via an upper seventh contact 79D. The lower electrode 71 is included in the organic photoelectric converter 70.

The second dielectric film 26b having less film thickness than that of the first dielectric film 26a is formed on the side surfaces of through holes 30H1 and 30H2 as with the through hole 30H according to the above-described first embodiment. The through holes 30H1 and 30H2 have the through electrode 34X and the through electrode 34Y formed therein. The first dielectric film 26a is formed on the first surface (surface 30S1) of the semiconductor substrate 30.

As described above, the imaging element 10B according to the present embodiment has a configuration in which the two organic photoelectric converters 20 and 70 and the one inorganic photoelectric converter 32 are stacked. As the dielectric film 26 formed on the first surface (surface 30S1) of the semiconductor substrate 30 and the side surfaces of the through holes 30H1 and 30H2, the second dielectric film 26b formed on the side surfaces of the through holes 30H1 and 30H2 is formed to have less film thickness than the film thickness of the first dielectric film 26a on the first surface (surface 30S1) of the semiconductor substrate 30. The through electrodes 34X and 34Y are electrically coupled to the organic photoelectric converters 20 and 70, respectively. The through electrodes 34X and 34Y pass through the through holes 30H1 and 30H2. This makes it possible to obtain effects similar to those of the above-described first embodiment.

3. Third Embodiment

FIG. 15 schematically illustrates a cross-sectional configuration of a photoelectric conversion element (imaging element 10C) according to a third embodiment of the present disclosure. The imaging element 10C is included in one pixel (unit pixel P) in an imaging device (imaging device 1) such as a CMOS image sensor used for an electronic apparatus such as a digital still camera or a video camera, for example. An organic photoelectric converter 80 according to the present embodiment is different from those of the above-described first and second embodiments in that the organic photoelectric converter 80 according to the present embodiment has a configuration in which a lower electrode 81, the photoelectric conversion layer 24, and the upper electrode 25 are stacked in this order and the lower electrode 81 is formed as a solid film in a pixel.

In the imaging element 10C, the one organic photoelectric converter 80 and the two inorganic photoelectric converters 32B and 32R are stacked in the vertical direction for each unit pixel P. The organic photoelectric converter 80 and the inorganic photoelectric converters 32B and 32R perform photoelectric conversion by selectively detecting the respective pieces of light in different wavelength bands. Specifically, for example, the organic photoelectric converter 80 acquires a color signal of green (G) as in the above-described first embodiment. There is provided a multilayer wiring layer 90 on the second surface (surface 30S2) of the semiconductor substrate 30. The multilayer wiring layer 90 has a configuration in which wiring layers 91, 92, and 93 are, for example, stacked in an insulating layer 94.

The organic photoelectric converter 80 is an organic photoelectric conversion element that absorbs light corresponding to a portion or all of a selective wavelength band (e.g., 450 nm or more and 650 nm or less) and generates electron-hole pairs. As described above, the organic photoelectric converter 80 includes, for example, the lower electrode 81 and the upper electrode 25 that are disposed to be opposed to each other and the photoelectric conversion layer 24 that is provided between the lower electrode 81 and the upper electrode 25. The lower electrode 81, the photoelectric conversion layer 24, and the upper electrode 25 of the organic photoelectric converter 80 according to the present embodiment each have a configuration similar to that of the organic photoelectric converter 20 according to the above-described first embodiment except that the lower electrode 81 is formed in each pixel by using a solid film as illustrated in FIG. 15.

For example, the floating diffusions (floating diffusion layers) FD1, FD2, and FD3, a vertical transistor (transfer transistor) Tr1, a transfer transistor Tr2, the amplifier transistor (modulation element) AMP, and the reset transistor RST are provided on the second surface (surface 30S2) of the semiconductor substrate 30.

The vertical transistor Tr1 is a transfer transistor that transfers, to the floating diffusion FD1, the signal charges (electrons here) generated and accumulated in the inorganic photoelectric converter 32B. The signal charges correspond to blue. The inorganic photoelectric converter 32B is formed at a deep position from the second surface (surface 30S2) of the semiconductor substrate 30 and it is thus preferable that a transfer transistor of the inorganic photoelectric converter 32B include the vertical transistor Tr1. The transfer transistor Tr2 transfers, to the floating diffusion FD2, signal charges corresponding to the red color generated and accumulated in the inorganic photoelectric converter 32R. The transfer transistor Tr2 includes, for example, a MOS transistor. The amplifier transistor AMP is a modulation element that modulates the amount of charges generated in the organic photoelectric converter 80 to a voltage. The amplifier transistor AMP includes, for example, a MOS transistor. The reset transistor RST resets charges transferred to the floating diffusion FD3 from the organic photoelectric converter 80 and includes, for example, a MOS transistor.

A lower first contact 95 and a lower second contact 96 each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

The imaging element 10C acquires signals of the respective colors as follows.
(Acquisition of Green Color Signal by Organic Photoelectric Converter 80)

First, green light of the pieces of light having entered the imaging element 10C is selectively detected (absorbed) by the organic photoelectric converter 80 to be subjected to photoelectric conversion.

The organic photoelectric converter 80 is coupled to the gate Gamp of the amplifier transistor AMP and the floating diffusion FD3 via the through electrode 34. Thus, the electrons of the electron-electron pairs generated in the organic photoelectric converter 80 are taken out from the lower electrode 81 side, transferred to the second surface (surface 30S2) side of the semiconductor substrate 30 via the through electrode 34, and accumulated in the floating diffusion FD3. At the same time as this, the amplifier transistor AMP modulates the amount of charges generated in the organic photoelectric converter 80 to a voltage.

In addition, the reset gate Grst of the reset transistor RST is disposed next to the floating diffusion FD3. This causes the reset transistor RST to reset the charges accumulated in the floating diffusion FD3.

Here, the organic photoelectric converter 80 is coupled to not only the amplifier transistor AMP, but also the floating diffusion FD3 via the through electrode 34, allowing the reset transistor RST to easily reset the charges accumulated in the floating diffusion FD3.

In contrast, in a case where the through electrode 34 and the floating diffusion FD3 are not coupled, it is difficult to reset the charges accumulated in the floating diffusion FD3, resulting in application of a large voltage to pull out the charges to the upper electrode 25 side. The photoelectric conversion layer 24 may be thus damaged. In addition, a structure that enables resetting in a short period of time leads to increased dark-time noise and results in a trade-off. This structure is thus difficult.
(Acquisition of Blue Color Signal and Red Color Signal by Inorganic Photoelectric Converters 32B and 32R)

Next, blue light and red light of the pieces of light having passed through the organic photoelectric converter 80 are absorbed and photoelectrically converted in order by the inorganic photoelectric converter 32B and the inorganic photoelectric converter 32R, respectively. In the inorganic photoelectric converter 32B, the electrons corresponding to the incident blue light are accumulated in an n region of the inorganic photoelectric converter 32B and the accumulated electrons are transferred to the floating diffusion FD1 by the vertical transistor Tr1. Similarly, in the inorganic photoelectric converter 32R, the electrons corresponding to the incident red light are accumulated in an n region of the inorganic photoelectric converter 32R and the accumulated electrons are transferred to the floating diffusion FD2 by the transfer transistor Tr2.

As described above, the imaging element 10C according to the present embodiment has the organic photoelectric converter 80 formed as a solid film. As the dielectric film 26 formed on the first surface (surface 30S1) of the semiconductor substrate 30 and the side surface of the through hole 30H, the second dielectric film 26b formed on the side surface of the through hole 30H is formed to have less film thickness than the film thickness of the first dielectric film 26a on the first surface (surface 30S1) of the semiconductor substrate 30. The through electrode 34 is electrically coupled to the organic photoelectric converter 80. The through electrode 34 passes through the through hole 30H. This makes it possible to obtain effects similar to those of the above-described first embodiment.

4. Modification Examples 4-1. Modification Example 1

FIG. 16 illustrates a cross-sectional configuration of an imaging element (imaging element 10D) according to a modification example 1 of the present disclosure. The imaging element 10D is included in one pixel (unit pixel P) in an imaging device (imaging device 1) such as a CMOS image sensor used for an electronic apparatus such as a digital still camera or a video camera, for example. The imaging element 10D according to the present modification example is formed to have a first dielectric film 66a provided to be partially thick on the first surface (surface 30S1) of the semiconductor substrate 30 serving as a light receiving surface. Specifically, the first dielectric film 66a is configured to be thick, for example, in the regions corresponding to the inorganic photoelectric converters 32B and 32R formed to be embedded in the semiconductor substrate 30.

The first dielectric film 66a according to the present modification example may be formed as a single-layer film and formed to be thicker in the regions corresponding to the inorganic photoelectric converters 32B and 32R than in the other regions, but may also be formed as a stacked film of a dielectric film 66A and a dielectric film 66B as illustrated in FIG. 16. It is to be noted that the dielectric film 66A and the dielectric film 66B may be formed by using the same materials or formed by using different materials.

As described above, in the imaging element 10D according to the present modification example, the first dielectric film 66a formed on the first surface (surface 30S1) of the semiconductor substrate 30 is formed to be thick only in the regions corresponding to the inorganic photoelectric converters 32B and 32R. Even if the first dielectric film 66a on the first surface (surface 30S1) of the semiconductor substrate 30 is made partially thick in this way, it is possible to obtain effects similar to those of the above-described first embodiment.

4-2. Modification Example 2

FIG. 17 schematically illustrates a configuration of a main section of an imaging element (imaging element 10E)

according to a modification example 2 of the present disclosure. In the above-described first to third embodiments and modification example 1, the examples have been demonstrated in which the through electrode 34 is provided for each pixel, but the position at which the through electrode 34 is formed is not limited thereto. For example, two or more pixels may be provided with each through electrode 34 or the through electrode 34 may be formed, for example, in the peripheral section 1b (peripheral region) provided around the pixel section 1a (pixel region) as illustrated in FIG. 17.

5. Application Examples

Application Example 1

FIG. 18 illustrates an overall configuration of an imaging device (imaging device 1) that includes, for each of the pixels, the imaging element 10A (or the imaging elements 10B to 10B) described in the above-described first to third embodiment (or the modification examples). This imaging device 1 is a CMOS image sensor and includes a pixel section 1a as an imaging area and a peripheral circuit section 130 in a peripheral region of this pixel section 1a on the semiconductor substrate 30. The peripheral circuit section 130 includes, for example, a row scanner 131, a horizontal selector 133, a column scanner 134, and a system controller 132.

The pixel section 1a includes, for example, the plurality of unit pixels P (each corresponding to the imaging element 10) that are two-dimensionally disposed in a matrix. In these unit pixels P, pixel drive lines Lread (specifically, row selection lines and reset control lines) are disposed in each of pixel rows, for example, and vertical signal lines Lsig are disposed in each of pixel columns. The pixel drive lines Lread are each for transmitting drive signals for reading out signals from pixels. One end of each of the pixel drive lines Lread is coupled to the output end of the row scanner 131 corresponding to each row.

The row scanner 131 is a pixel driver that includes a shift register, an address decoder, and the like and drives the respective unit pixels P of the pixel section 1a, for example, row by row. Signals outputted from the respective unit pixels P in the pixel rows selectively scanned by the row scanner 131 are supplied to the horizontal selector 133 through the respective vertical signal lines Lsig. The horizontal selector 133 includes an amplifier, a horizontal selection switch, and the like provided for each of the vertical signal lines Lsig.

The column scanner 134 includes a shift register, an address decoder, and the like and drives each of the horizontal selection switches of the horizontal selector 133 in order while scanning the horizontal selection switches. The selective scanning by this column scanner 134 causes the signals of the respective pixels transmitted through the respective vertical signal lines Lsig to be outputted in order to a horizontal signal line 135 and transmitted to the outside of the semiconductor substrate 30 through the horizontal signal line 135.

Circuit portions including the row scanner 131, the horizontal selector 133, the column scanner 134, and the horizontal signal line 135 may be formed directly on the semiconductor substrate 30 or disposed in external control IC. In addition, those circuit portions may be formed on another substrate coupled by a cable or the like.

The system controller 132 receives a clock supplied from the outside of the semiconductor substrate 30, data for an instruction about an operation mode, and the like and outputs data such as internal information of the imaging device 1. The system controller 132 further includes a timing generator that generates various timing signals and controls the driving of the peripheral circuits such as the row scanner 131, the horizontal selector 133, the column scanner 134, and the like on the basis of the various timing signals generated by the timing generator.

Application Example 2

The above-described imaging device 1 is applicable, for example, to any type of electronic apparatus having an imaging function including a camera system such as a digital still camera and a video camera, a mobile phone having an imaging function, and the like. FIG. 19 illustrates a schematic configuration of an electronic apparatus 2 (camera) as an example thereof. This electronic apparatus 2 is, for example, a video camera that is able to shoot a still image or a moving image. The electronic apparatus 2 includes the imaging device 1, an optical system (optical lens) 310, a shutter device 311, a driver 313 that drives the imaging device 1 and the shutter device 311, and a signal processor 312.

The optical system 310 guides image light (incident light) from a subject to the pixel section 1a of the imaging device 1. This optical system 310 may include a plurality of optical lenses. The shutter device 311 controls a period in which the imaging device 1 is irradiated with light and a period in which light is blocked. The driver 313 controls a transfer operation of the imaging device 1 and a shutter operation of the shutter device 311. The signal processor 312 performs various kinds of signal processing on a signal outputted from the imaging device 1. An image signal Dout subjected to the signal processing is stored in a storage medium such as a memory or outputted to a monitor or the like.

Further, the above-described imaging device 1 is also applicable to the following electronic apparatuses (a capsule type endoscope 10100 and a mobile body such as a vehicle).

Application Example 3

Example of Application to In-Vivo Information Acquisition System

Further, the technology (the present technology) according to the present disclosure is applicable to a variety of products. For example, the technology according to the present disclosure may be applied to an endoscopic surgery system.

FIG. 20 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 20, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The above has described the example of the in-vivo information acquisition system to which the technology according to the present disclosure may be applied. The technology according to the present disclosure may be applied, for example, to the image pickup unit 10112 among the above-described components. This increases the detection accuracy.

Application Example 4

Example of Application to Endoscopic Surgery System

The technology (the present technology) according to the present disclosure is applicable to a variety of products. For example, the technology according to the present disclosure may be applied to an endoscopic surgery system.

FIG. 21 is a view depicting an example of a schematic configuration of an endoscopic surgery system to which the technology according to an embodiment of the present disclosure (present technology) can be applied.

In FIG. 21, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 22 is a block diagram depicting an example of a functional configuration of the camera head 11102 and the CCU 11201 depicted in FIG. 21.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied to the image pickup unit 11402 among the above-described components. Applying the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

Application Example 5

Example of Application to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 23 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 23, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 23, an audio speaker 12061, a display section 12062, and an instrument panel 12063 are illustrated as the output device. The display section 12062 may, for example, include at least one of an on-board display and a head-up display.

FIG. 24 is a diagram depicting an example of the installation position of the imaging section 12031.

In FIG. 24, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 24 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although the description has been given with reference to the first and third embodiments, the modification examples 1 and 2, and the application examples, the contents of the present disclosure are not limited to the above-described embodiments and the like. The present disclosure may be modified in a variety of ways. For example, in the above-described embodiments, an imaging element has a configuration in which the organic photoelectric converter 20 that detects green light and the inorganic photoelectric converters 32B and 32R that respectively detect blue light and red light are stacked. However, the contents of the present disclosure are not limited to such a structure. That is, the organic photoelectric converter may detect the red light or the blue light or the inorganic photoelectric converters may each detect the green light.

In addition, the number of these organic photoelectric converters and inorganic photoelectric converters or the proportion therebetween are not limited. Color signals of a plurality of colors may be obtained with the organic photoelectric converter alone.

Further, in the above-described embodiments and the like, the examples have been demonstrated in which a plurality of electrodes included in the lower electrode 21 includes the two electrodes of the readout electrode 21A and the accumulation electrode 21B. There may be, however, provided additionally three or four or more electrodes including a transfer electrode, a discharge electrode, or the like.

It is to be noted that the effects described herein are merely examples, but not limitative. In addition, there may be other effects.

It is to be noted that the present disclosure may have the following configurations.

(1)

An imaging element including:

a semiconductor substrate having one surface and another surface that are opposed to each other, the semiconductor substrate having a through hole penetrating between the one surface and the other surface;

a first photoelectric converter that is provided above the one surface of the semiconductor substrate;

a through electrode that is electrically coupled to the first photoelectric converter, the through electrode penetrating the semiconductor substrate inside the through hole;

a first dielectric film that is provided on the one surface of the semiconductor substrate, the first dielectric film having first film thickness; and a second dielectric film that is provided on a side surface of the through hole, the second dielectric film having second film thickness, the second film thickness being less than the first film thickness.

(2)

The imaging element according to (1), in which the semiconductor substrate further includes an amplifier transistor and a floating diffusion layer on the other surface side, and the through electrode is electrically coupled to at least one of the amplifier transistor or the floating diffusion layer.

(3)

The imaging element according to (1) or (2), in which at least one of the first dielectric film or the second dielectric film includes a stacked film.

(4)

The imaging element according to any of (1) to (3), in which the first film thickness of the first dielectric film is 10 nm or more and 1000 nm or less, and the second film thickness of the second dielectric film is 1 nm or more and 200 nm or less.

(5)

The imaging element according to any of (1) to (4), in which the first dielectric film has film thickness that varies between regions on the semiconductor substrate.

(6)

The imaging element according to any of (1) to (5), in which a second photoelectric converter is formed to be embedded in the semiconductor substrate, and film thickness of the first dielectric film above the second photoelectric converter is greater than film thickness in a region around the through electrode.

(7)

The imaging element according to any of (1) to (6), in which the first dielectric film is formed by using materials that are different between regions on the semiconductor substrate.

(8)

The imaging element according to any of (1) to (7), in which the first dielectric film and the second dielectric film each include at least one of a material having a negative fixed charge or a semiconductor material or an electrically conductive material having a wider band gap than a band gap of the semiconductor substrate.

(9)

The imaging element according to any of (1) to (8), in which the second dielectric film has film thickness that varies between a region near the one surface and a region near the other surface, and film thickness in the region near the one surface is greater than film thickness in the region near the other surface.

(10)

The imaging element according to any of (1) to (9), in which the through electrode includes an insulating film around the through electrode inside the through hole.

(11)

The imaging element according to any of (1) to (10), in which the semiconductor substrate includes a plurality of pixels in a planar direction, and the through electrode is provided for each of the pixels.

(12)

The imaging element according to any of (1) to (11), in which the semiconductor substrate includes a plurality of pixels in a planar direction, and two or more of the pixels are provided with each through electrode.

(13)

The imaging element according to any of (1) to (12), including a pixel region and a peripheral region in a planar direction of the semiconductor substrate, the peripheral region surrounding the pixel region, in which the through electrode is provided in the peripheral region.

(14)

The imaging element according to any of (1) to (13), in which the first photoelectric converter includes a first electrode and a second electrode and an organic photoelectric conversion layer and the first electrode includes a plurality of electrodes, the first electrode and the second electrode being disposed to be opposed to each other, the organic photoelectric conversion layer being provided between the first electrode and the second electrode.

(15)

The imaging element according to any of (6) to (14), further including a third photoelectric converter inside the semiconductor substrate, the third photoelectric converter being stacked on the second photoelectric converter.

(16)

The imaging element according to any of (6) to (14), further including a third photoelectric converter above the one surface of the semiconductor substrate, the third photoelectric converter being stacked on the first photoelectric converter.

(17)

The imaging element according to any of (1) to (16), in which a multilayer wiring layer is formed on the other surface of the semiconductor substrate.

(18)

An imaging device including a plurality of pixels that is each provided with one or more imaging elements, the imaging elements each including
a semiconductor substrate having one surface and another surface that are opposed to each other, the semiconductor substrate having a through hole penetrating between the one surface and the other surface,
a first photoelectric converter that is provided above the one surface of the semiconductor substrate,
a through electrode that is electrically coupled to the first photoelectric converter, the through electrode penetrating the semiconductor substrate inside the through hole,
a first dielectric film that is provided on the one surface of the semiconductor substrate, the first dielectric film having first film thickness, and
a second dielectric film that is provided on a side surface of the through hole, the second dielectric film having second film thickness, the second film thickness being less than the first film thickness.

The present application claims the priority on the basis of Japanese Patent Application No. 2018-134286 filed on Jul. 17, 2018 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging element comprising:
a semiconductor substrate having one surface and another surface that are opposed to each other, the semiconductor substrate having a through hole penetrating between the one surface and the other surface;
a first photoelectric converter above the one surface of the semiconductor substrate;
a through electrode that is electrically coupled to the first photoelectric converter, the through electrode penetrating the semiconductor substrate inside the through hole;
a first dielectric film on the one surface of the semiconductor substrate, the first dielectric film having a first film thickness; and
a second dielectric film on a side surface of the through hole, the second dielectric film having a second film thickness, the second film thickness being less than the first film thickness.

2. The imaging element according to claim 1, wherein
the semiconductor substrate further includes an amplifier transistor and a floating diffusion layer on a side of the other surface, and
the through electrode is electrically coupled to at least one of the amplifier transistor or the floating diffusion layer.

3. The imaging element according to claim 1, wherein at least one of the first dielectric film or the second dielectric film includes a stacked film.

4. The imaging element according to claim 1, wherein
the first film thickness of the first dielectric film is 10 nm or more and 1000 nm or less, and
the second film thickness of the second dielectric film is 1 nm or more and 200 nm or less.

5. The imaging element according to claim 1, wherein the first dielectric film has a film thickness that varies between regions on the semiconductor substrate.

6. The imaging element according to claim 1, wherein
a second photoelectric converter is embedded in the semiconductor substrate, and
a film thickness of the first dielectric film above the second photoelectric converter is greater than a film thickness of the first dielectric film in a region around the through electrode.

7. The imaging element according to claim 1, wherein the first dielectric film includes materials that are different between regions on the semiconductor substrate.

8. The imaging element according to claim 1, wherein the first dielectric film and the second dielectric film each include at least one of a material having a negative fixed charge or a semiconductor material or an electrically conductive material having a wider band gap than a band gap of the semiconductor substrate.

9. The imaging element according to claim 1, wherein
the second dielectric film has a film thickness that varies between a region near the one surface and a region near the other surface, and
the film thickness of the second dielectric film in the region near the one surface is greater than the film thickness of the second dielectric film in the region near the other surface.

10. The imaging element according to claim 1, wherein the through electrode includes an insulating film around the through electrode inside the through hole.

11. The imaging element according to claim 1, wherein
the semiconductor substrate includes a plurality of pixels in a planar direction, and
the through electrode is for each of the plurality of pixels.

12. The imaging element according to claim 1, wherein
the semiconductor substrate includes a plurality of pixels in a planar direction, and
each of two or more pixels of the plurality of pixels includes the through electrode.

13. The imaging element according to claim 1, further comprising: a pixel region; and a peripheral region in a planar direction of the semiconductor substrate, the peripheral region surrounding the pixel region, wherein
the through electrode is in the peripheral region.

14. The imaging element according to claim 1, wherein the first photoelectric converter includes a first electrode; a second electrode; and an organic photoelectric conversion layer; the first electrode includes a plurality of electrodes, the first electrode and the second electrode are opposed to each other, and the organic photoelectric conversion layer is between the first electrode and the second electrode.

15. The imaging element according to claim 6, further comprising a third photoelectric converter inside the semiconductor substrate, the third photoelectric converter being stacked on the second photoelectric converter.

16. The imaging element according to claim 6, further comprising a third photoelectric converter above the one surface of the semiconductor substrate, the third photoelectric converter being stacked on the first photoelectric converter.

17. The imaging element according to claim 1, wherein a multilayer wiring layer is on the other surface of the semiconductor substrate.

18. An imaging device comprising
a plurality of pixels that each includes one or more imaging elements,
the one or more imaging elements each including:
a semiconductor substrate having one surface and another surface that are opposed to each other, the semiconductor substrate having a through hole penetrating between the one surface and the other surface, a first photoelectric converter above the one surface of the semiconductor substrate, a through electrode that is electrically coupled to the first photoelectric converter, the through electrode penetrating the semiconductor substrate inside the through hole, a first dielectric film on the one surface of the semiconductor substrate, the first dielectric film having a first film thickness, and a second dielectric film on a side surface of the through hole, the second dielectric film having a second film thickness, the second film thickness being less than the first film thickness.

\* \* \* \* \*